(12) United States Patent
Okunishi

(10) Patent No.: US 9,754,766 B2
(45) Date of Patent: Sep. 5, 2017

(54) PLASMA PROCESSING APPARATUS

(71) Applicant: Tokyo Electron Limited, Tokyo (JP)

(72) Inventor: Naohiko Okunishi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/785,471

(22) PCT Filed: May 14, 2014

(86) PCT No.: PCT/JP2014/002549
§ 371 (c)(1),
(2) Date: Oct. 19, 2015

(87) PCT Pub. No.: WO2014/188681
PCT Pub. Date: Nov. 27, 2014

(65) Prior Publication Data
US 2016/0126067 A1    May 5, 2016

(30) Foreign Application Priority Data

May 21, 2013  (JP) .................................. 2013-106895

(51) Int. Cl.
*H03K 19/17* (2006.01)
*H01J 37/32* (2006.01)
(Continued)

(52) U.S. Cl.
CPC .... *H01J 37/32091* (2013.01); *C23C 16/4412* (2013.01); *C23C 16/50* (2013.01);
(Continued)

(58) Field of Classification Search
USPC ........... 315/500, 501, 111.21, 111.41, 111.71
See application file for complete search history.

(56) References Cited

U.S. PATENT DOCUMENTS

| 5,726,611 A | 3/1998 | Takagi |
| 2008/0197780 A1 | 8/2008 | Yamazawa |
| 2009/0133839 A1 | 5/2009 | Yamazawa |

FOREIGN PATENT DOCUMENTS

| JP | 02-138409 U | 11/1990 |
| JP | 07-106138 A | 4/1995 |

(Continued)

OTHER PUBLICATIONS

International Search Report for PCT/JP2014/002549 dated Jul. 1, 2014.

*Primary Examiner* — Douglas W Owens
*Assistant Examiner* — Jianzi Chen
(74) *Attorney, Agent, or Firm* — Pearne & Gordon LLP

(57) ABSTRACT

A resonance frequency is adjusted or optimized by shifting the resonance frequency without reducing an impedance function or a withstand voltage characteristic against a high frequency noise, when blocking, by using a multiple parallel resonance characteristic of a distributed constant line, the high frequency noise introduced into a line such as a power feed line or a signal line from an electrical member other than a high frequency electrode within a processing vessel. Regarding winding pitches, each of the solenoid coils 104(1) and 104(2) is divided to multiple sections $K_1$, $K_2$, ... in a coil axis direction, and, a winding pitch $p_i$ in each section $K_i$ ($i=1, 2, ...$) is set independently. Comb teeth M inserted into winding gaps of both solenoid coils 104(1) and 104(2) are formed on inner surfaces of multiple rod-shaped comb-teeth member 114 provided adjacent to the solenoid coils 104(1) and 104(2).

18 Claims, 23 Drawing Sheets

(51) Int. Cl.
*H01F 27/00* (2006.01)
*C23C 16/44* (2006.01)
*C23C 16/50* (2006.01)
*H03H 1/00* (2006.01)

(52) U.S. Cl.
CPC ...... *H01F 27/006* (2013.01); *H01J 37/32174* (2013.01); *H01J 37/32724* (2013.01); *H03H 2001/0092* (2013.01)

(56) References Cited

FOREIGN PATENT DOCUMENTS

| | | | |
|---|---|---|---|
| JP | 10-284429 | A | 10/1998 |
| JP | 2002-313633 | A | 10/2002 |
| JP | 2008-198902 | A | 8/2008 |
| JP | 2009-123505 | A | 6/2009 |
| JP | 2011-135052 | A | 7/2011 |

(COMPARISON REFERENCE As)

(DIVISION PATTERN A2)

(DIVISION PATTERN B2)

(DIVISION PATTERN B3)

(DIVISION PATTERN B4)

(DIVISION PATTERN B5)

(DIVISION PATTERN C2)

(DIVISION PATTERN C3)

(DIVISION PATTERN C4)

(DIVISION PATTERN C5)

PLASMA PROCESSING APPARATUS

CROSS-REFERENCE TO RELATED APPLICATION

This Application is a U.S. national phase application under 35 U.S.C. §371 of PCT Application No. PCT/JP2014/002549 filed on May 14, 2014, which claims the benefit of Japanese Patent Application No. 2013-106895 filed on May 21, 2013, the entire disclosures of which are incorporated herein by reference.

TECHNICAL FIELD

The embodiments described herein pertain generally to a plasma processing apparatus configured to perform a plasma process on a processing target substrate by using a high frequency power; and, more particularly, to a plasma processing apparatus equipped with a filter for blocking a high frequency noise introduced into a line such as a power feed line or a signal line from an electrical member other than a high frequency electrode within a processing vessel.

BACKGROUND ART

In micro-processing for manufacturing a semiconductor device or a FPD (Flat Panel Display) using plasma, it is very important to control a temperature or a temperature distribution of a processing target substrate (a semiconductor wafer, a glass substrate, etc.) as well as to control a plasma density distribution on the processing target substrate. If the temperature control of the substrate is not properly performed, not only the uniformity of a surface reaction of the substrate but also the uniformity of process characteristics may not be achieved, so that a production yield of semiconductor devices or display devices is decreased.

In general, a mounting table or susceptor, which mounts thereon a processing target substrate within a chamber of a plasma processing apparatus (particularly, a capacitively coupled plasma processing apparatus), has a function as a high frequency electrode that applies a high frequency power into a plasma space, a function as a holder that holds thereon the substrate by electrostatic attraction or the like, and a function as a temperature controller that controls the temperature of the substrate to a preset temperature through heat transfer. As for the temperature control function, it is required to appropriately correct a heat input characteristic distribution of the substrate affected by non-uniform radiant heat from plasma or a wall of the chamber, or a heat distribution affected by a substrate supporting structure.

Conventionally, in order to control the temperature of the susceptor and, further, the temperature of the substrate, a heater structure is widely employed. In this heater structure, a heating element that generates heat by an electric current applied thereto is provided in the susceptor, and Joule heat generated by the heating element is controlled. When using this heater structure, however, a part of a high frequency power applied to the susceptor from a high frequency power supply may be easily introduced into a heater power feed line through the heating element as a noise. If this high frequency noise reaches a heater power supply through the heater power feed line, operation and performance of the heater power supply is degraded. Furthermore, if a high frequency current flows in the heater power feed line, the high frequency power may be wasted. Typically, to solve these problems, a filter that reduces or blocks the high frequency noise flowing from the heating element embedded in the susceptor is provided on the heater power feed line.

The present applicant describes, in Patent Document 1, a filter technique that provides improved stability and reproducibility of filter performance for blocking a high frequency noise introduced to a line such as a power feed line or a signal line from an electrical member other than a high frequency electrode within a processing vessel of a plasma processing apparatus. This filter technique employs a regular multiple parallel resonance characteristic of a distributed constant line. Accordingly, only one coil is provided within the filter, and, also, stable noise blocking characteristic less affected by the apparatus difference can be obtained.

Further, the present applicant also describes, in Patent Document 1, a technique of a parallel resonance frequency adjuster capable of controlling at least one of multiple parallel resonance frequencies by locally changing characteristic impedance of the distributed constant line by way of, for example, coaxially providing a conductive ring member between the coil and an outer conductor. Since at least one of the multiple parallel resonance frequencies can be set to be equal to or approximate to a frequency of a high frequency noise to be blocked, sufficiently high impedance as required can be applied to the frequency of this high frequency noise by the parallel resonance frequency adjuster. Thus, the heater power supply can be protected securely, and reproducibility and reliability of the plasma process can be improved.

Patent Document 1: Japanese Patent Laid-open Publication No. 2011-135052

DISCLOSURE OF THE INVENTION

Problems to be Solved by the Invention

However, in the prior art described in Patent Document 1, since a distance between the coil and the outer conductor is locally narrowed at the position where the ring member is provided, an impedance function and a withstand voltage characteristic of the coil against the high frequency noise are degraded. That is, a potential of a high frequency power on the heater power feed line is as high (e.g., several thousands of volts) as a surface potential of a power feed rod or the susceptor (lower high frequency electrode) at an inlet portion of a filter unit. Further, the potential of the high frequency power decreases gradually in an axis direction along a winding of the coil within the filter unit, and becomes several tens of volts at a termination end of the coil. If the ring member as mentioned above is provided, however, the high frequency noise flows to the ground on the way down the coil while bypassing an air gap and the ring member provided outwardly in a radial direction. As a result, the impedance function of the filter unit against the high frequency noise cannot be sufficiently exerted, and damage or early degradation of components (coil conductor, coil tube, ring member, etc.) in the vicinity of a bypass in which the high current flows may easily occur.

In view of the foregoing problems, exemplary embodiments provide a plasma processing apparatus including a filter capable of adjusting or optimizing a resonance frequency by shifting the resonance frequency as required without reducing an impedance function or a withstand voltage characteristic against a high frequency noise, when blocking, by using a multiple parallel resonance characteristic of a distributed constant line, the high frequency noise introduced into a line such as a power feed line or a signal line from an electrical member other than a high frequency electrode within a processing vessel.

Means for Solving the Problems

In one exemplary embodiment, a plasma processing apparatus, in which a high frequency power supply is electrically connected to a high frequency electrode within a processing vessel for performing a plasma process, includes a filter configured to reduce or block a high frequency noise of a predetermined frequency introduced into a power feed line, which is configured to electrically connect a heating element within the high frequency electrode and a heater power supply, via the heating element. The filter includes a single solenoid coil forming a part of the line; and a cylindrical outer conductor, accommodating or surrounding the solenoid coil, configured to form, by being combined with the solenoid coil, a distributed constant line in which parallel resonance occurs at multiple frequencies. Further, the solenoid coil has a first section and a second section having different winding pitches in an axis direction thereof.

In this exemplary embodiment, by changing inductance and electrostatic capacitance of the coaxial line per a unit length while allowing a distance interval of the distributed constant line or a coaxial line formed between the solenoid coil and the outer conductor to be uniform, characteristic impedance is changed in each section, so that a part or all of resonance frequencies of multiple parallel resonance can be shifted.

In another exemplary embodiment, a plasma processing apparatus includes an external circuit of a power meter or a signal meter electrically connected via a line to an electrical member within a processing vessel in which a plasma process is performed. In the plasma processing apparatus, a high frequency noise of a predetermined frequency introduced from the electrical member into the line toward the external circuit is reduced or blocked by a filter provided on the line. The filter includes a single solenoid coil which forms a part of the line and has a first section and a second section having independent winding pitches in the axis direction; a cylindrical outer conductor, accommodating or surrounding the solenoid coil, configured to form, by being combined with the solenoid coil, a distributed constant line in which parallel resonance occurs at multiple frequencies; first comb teeth which are made of an insulating material and inserted into winding gaps of the first section of the solenoid coil locally at plural positions in a circumferential direction thereof; and a second coil tube which is made of an insulating material and configured to block winding gaps of the second section of the solenoid coil entirely in the circumferential direction thereof.

In this exemplary embodiment, the independent winding pitches are selected within the first and second sections of the solenoid coil individually. In the first section, the first comb teeth made of the insulating material are inserted into the winding gaps of the solenoid coil locally at the plural positions in the circumferential direction thereof, and in the second section, the winding gaps of the solenoid coil are blocked by the second coil tube entirely in the circumferential direction thereof. In this configuration as well, characteristic impedance is changed in each section while allowing the distance interval of the distributed constant line or the coaxial line formed between the solenoid coil and the outer conductor to be uniform, so that a part or all of resonance frequencies of multiple parallel resonance can be shifted.

In yet another exemplary embodiment, a plasma processing apparatus includes an external circuit of a power meter or a signal meter electrically connected via a line to an electrical member within a processing vessel in which a plasma process is performed. In the plasma processing apparatus, a high frequency noise of a predetermined frequency introduced from the electrical member into the line toward the external circuit is reduced or blocked by a filter provided on the line. The filter includes a single solenoid coil forming a part of the line; and a cylindrical outer conductor, accommodating or surrounding the solenoid coil, configured to form, by being combined with the solenoid coil, a distributed constant line in which parallel resonance occurs at multiple frequencies. Further, the solenoid coil has a first section and a second section in which coil conductors are respectively insulation-coated with a first coil tube and a second coil tube having different dielectric constants in the axis direction thereof.

In this exemplary embodiment, by changing electrostatic capacitance of the coaxial line per a unit length while allowing the distance interval of the coaxial line formed between the solenoid coil and the outer conductor, characteristic impedance is changed in each section, so that a part or all of resonance frequencies of multiple parallel resonance can be shifted.

Effect of the Invention

According to the plasma processing apparatus of the exemplary embodiments, with the above-described configuration and operation, it is possible to adjust or optimize a resonance frequency by shifting the resonance frequency as required without reducing an impedance function or a withstand voltage characteristic against a high frequency noise, when blocking, by using a multiple parallel resonance characteristic of a distributed constant line, a high frequency noise introduced into a line such as a power feed line or a signal line from the electrical member other than the high frequency electrode within the processing vessel.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following, exemplary embodiments will be described in detail, and reference is made to the accompanying drawings, which form a part of the description.

<Overall Configuration of Plasma Processing Apparatus>

Figure 1:
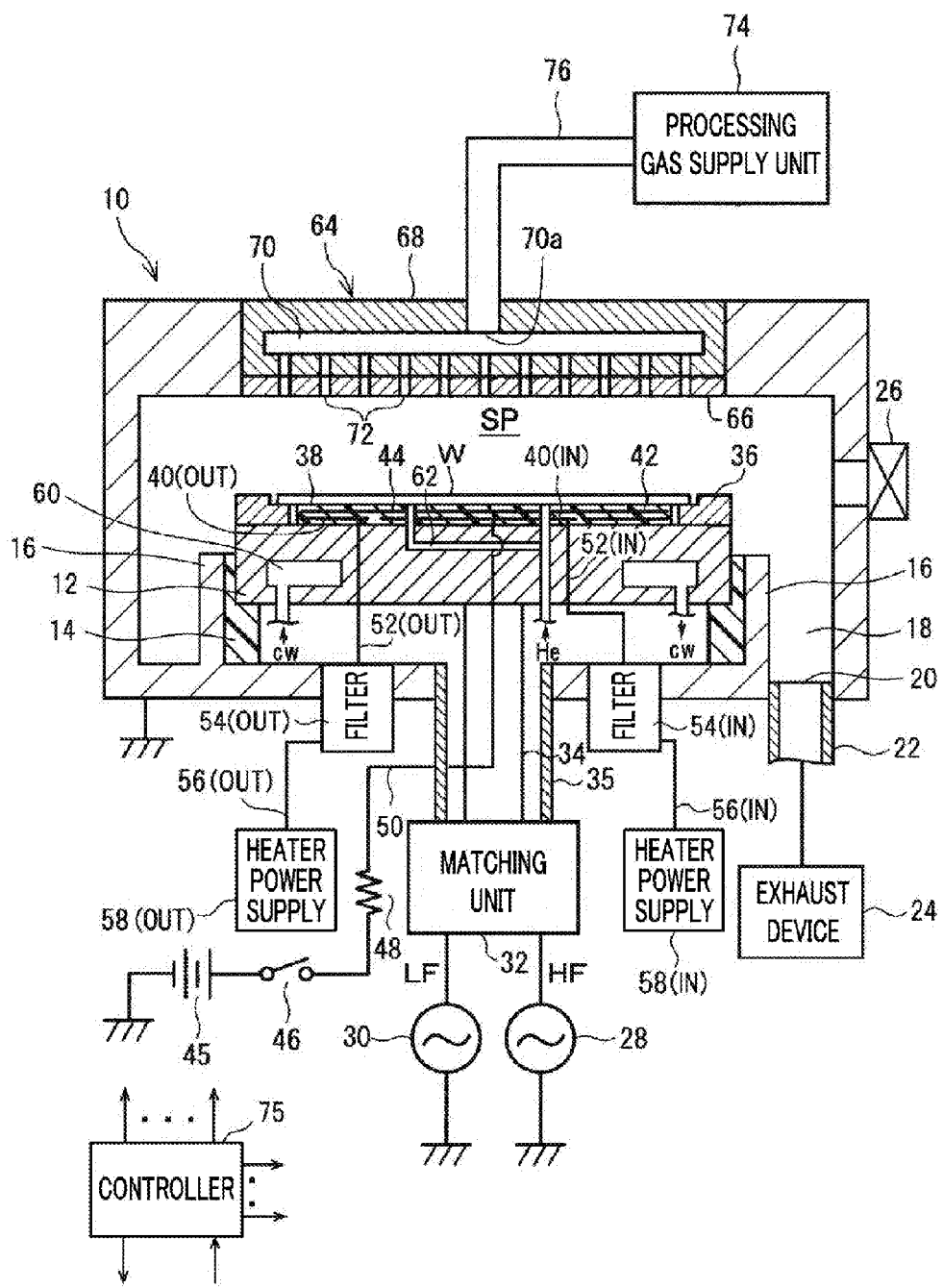
FIG. 1 is a longitudinal cross sectional view illustrating an overall configuration of a plasma processing apparatus in accordance with an exemplary embodiment.

FIG. 1 illustrates a configuration of a plasma processing apparatus in accordance with an exemplary embodiment. The plasma processing apparatus is configured as a capacitively coupled plasma etching apparatus in which dual frequency powers are applied to a lower electrode. The plasma etching apparatus includes a cylindrical chamber (processing vessel) 10 made of, e.g., a metal material such as aluminum or stainless steel. The chamber 10 is grounded.

A circular plate-shaped susceptor 12 configured to mount thereon a processing target substrate, e.g., a semiconductor wafer W is horizontally disposed as a lower electrode in the chamber 10. The susceptor 12 is made of, but not limited to, aluminum and supported on an insulating cylindrical supporting member 14 without being grounded. The insulating cylindrical supporting member 14 is made of, but not limited to, a ceramic material and vertically extended upwards from a bottom of the chamber 10. An annular exhaust path 18 is formed between an inner wall of the chamber 10 and a conductive cylindrical supporting member 16 that is vertically extended upwards from the bottom of the chamber 10 along a periphery of the insulating cylindrical supporting member 14. An exhaust opening 20 is formed at a bottom of the exhaust path 18, and an exhaust device 24 is connected to the exhaust opening 20 through an exhaust pipe 22. The exhaust device 24 includes a vacuum pump such as a turbo molecular pump and is capable of depressurizing a processing space within the chamber 10 to a required vacuum level. A gate valve 26 configured to open and close a loading/unloading opening for the semiconductor wafer W is provided at a sidewall of the chamber 10.

The susceptor 12 is electrically connected with a first high frequency power supply 28 and a second high frequency power supply 30 via a matching unit 32 and a power feed rod 34. The first high frequency power supply 28 is configured to output a first high frequency power HF of a certain frequency (typically, equal to or higher than, e.g., about 27 MHz, desirably, 60 MHz or higher) that mainly contributes to plasma generation. Meanwhile, the second high frequency power supply 30 is configured to output a second high frequency power LF of a certain frequency (typically, equal to or lower than, e.g., about 13 MHz) that mainly contributes to ion attraction into the semiconductor wafer W mounted on the susceptor 12. The matching unit 32 accommodates a first matching device and a second matching device (not shown) configured to match impedance between the first and second high frequency power supplies 28 and 30 and a plasma load, respectively.

The power feed rod 34 is made of a cylindrical or columnar conductor having a certain outer diameter. An upper end of the power feed rod 34 is connected to a central portion of a bottom surface of the susceptor 12, and a lower end of the power feed rod 34 is connected to high frequency output terminals of the first and second matching devices within the matching unit 32. Further, a cylindrical conductive cover 35 surrounding the power feed rod 34 is provided between a bottom surface of the chamber 10 and the matching unit 32. To elaborate, a circular opening having a certain diameter larger than the outer diameter of the power feed rod 34 is formed at the bottom surface of the chamber 10. An upper end of the conductive cover 35 is connected to this opening of the chamber while a lower end thereof is connected to ground (returning wire) terminals of the matching devices.

The susceptor 12 has a diameter larger than that of the semiconductor wafer W. A top surface of the susceptor 12 is divided into a central region having the substantially same shape (circular shape) and the substantially same size as those of the wafer W, i.e., a wafer mounting portion; and an annular peripheral region extended outwards from the wafer mounting portion. The semiconductor wafer W as a processing target object is mounted on the wafer mounting portion. A ring-shaped plate member, i.e., a so-called focus ring 36 is mounted on the annular peripheral region. The focus ring 36 has an inner diameter larger than the diameter of the semiconductor wafer W and may be made of, by way of example, but not limitation, one of Si, SiC, C and $SiO_2$ depending on a material of the semiconductor wafer W to be etched.

An electrostatic chuck 38 configured to attract and hold the wafer and a heating element 40 are provided on the wafer mounting portion of the top surface of the susceptor 12. In the electrostatic chuck 38, a DC electrode 44 is embedded within a film-shaped or plate-shaped dielectric member 42 that is formed or fastened on the top surface of the susceptor 12 as one body therewith. The DC electrode 44 is electrically connected with a DC power supply 45 provided at the outside of the chamber 10 via a switch 46, a resistor 48 having a high resistance value and a DC high voltage line 50. If a high DC voltage is applied to the DC electrode 44 from the DC power supply 45, the semiconductor wafer W can be attracted to and held on the electrostatic chuck 38 by an electrostatic force. The DC high voltage line 50 is a coated line and is connected to the DC electrode 44 of the electrostatic chuck 38 while penetrating the susceptor 12 from below after passing through the inside of the cylindrical power feed rod 34.

Figure 3:
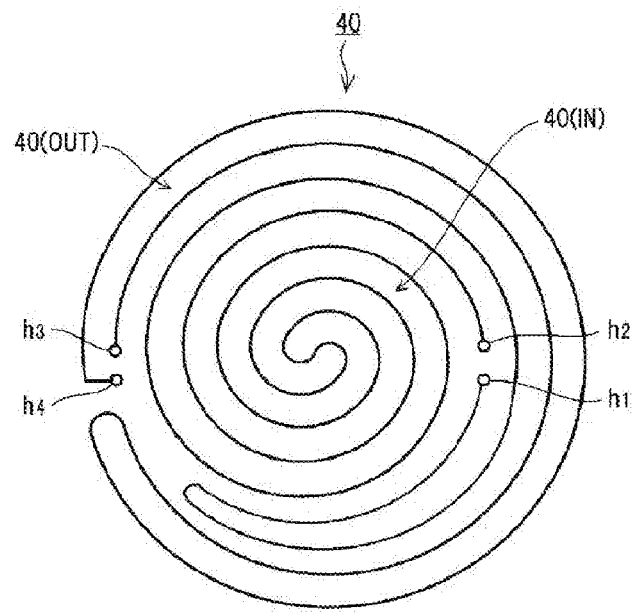
FIG. 3 is a diagram illustrating a configuration example of the heating element in the exemplary embodiment.

The heating element 40 is implemented by, for example, a resistance heating wire having a spiral shape, which is embedded in the dielectric member 42 of the electrostatic chuck 38 along with the DC electrode 44. In this exemplary embodiment, this heating element 40 is divided in two parts in a radial direction of the susceptor 12: an inner heating wire 40(IN) and an outer heating wire 40(OUT), as depicted in FIG. 3. Among these components, the inner heating wire 40(IN) is electrically connected to a dedicated heater power supply 58(IN) provided at the outside of the chamber 10 via power feed conductors 52(IN) covered with an insulating coating, a filter unit 54(IN) and electric cables 56(IN). The outer heating wire 40(OUT) is electrically connected to a dedicated heater power supply 58(OUT) provided at the outside of the chamber 10 via power feed conductors 52(OUT) covered with an insulating coating, a filter unit 54(OUT) and electric cables 56(OUT). Among these components, the filter units 54(IN) and 54(OUT) are primary features of the present exemplary embodiment, and an internal configuration and an operation of these filter units will be described in detail later.

An annular coolant room or coolant path 60 extended along, e.g., a circumferential direction is formed within the susceptor 12. A coolant of a preset temperature, e.g., cooling water cw from a chiller unit (not shown) is supplied into and circulated through the coolant path 60 via a coolant supply line. A temperature of the susceptor 12 can be reduced by adjusting the temperature of the coolant. Further, a heat transfer gas such as a He gas from a heat transfer gas supply unit (not shown) is supplied to an interface between the electrostatic chuck 38 and the semiconductor wafer W through a gas supply line and a gas passage 62 within the susceptor 12 in order to thermally connect the semiconductor wafer W to the susceptor 12.

A shower head 64 serving as an upper electrode is provided at a ceiling of the chamber 10, facing the susceptor 12 in parallel. The shower head 64 includes an electrode plate 66 directly facing the susceptor 12; and an electrode supporting body 68 configured to support the electrode plate 66 from a backside thereof (from above it) in a detachable manner. A gas room 70 is formed within the electrode supporting body 68, and a multiple number of gas discharge holes 72 extended from the gas room 70 toward the susceptor 12 are formed through the electrode supporting body 68 and the electrode plate 66. A space SP between the electrode plate 66 and the susceptor 12 serves as a plasma generation space or a processing space. A gas supply line 76 led from a processing gas supply unit 74 is connected to a gas inlet opening 70a formed at a top portion of the gas room 70. The electrode plate 66 may be made of, by way of non-limiting example, but not limitation, Si, SiC or C, and the electrode supporting body 68 may be made of, by way of example, but not limitation, alumite-treated aluminum.

Operations of individual components of the plasma etching apparatus, e.g., the exhaust device 24, the high frequency power supplies 28 and 30, the switch 46 of the DC power supply 45, the heater power supplies 58(IN) and 58(OUT), the chiller unit (not shown), the heat transfer gas supply unit (not shown), the processing gas supply unit 74, and so forth and the overall operation (sequence) of the plasma etching apparatus are controlled by a controller 75 having a microcomputer.

In this plasma etching apparatus, in order to perform an etching process, the gate valve 26 is first opened, and the semiconductor wafer W to be processed is loaded into the chamber 10 and mounted on the electrostatic chuck 38. Then, an etching gas (generally, a mixture gas) is introduced into the chamber 10 from the processing gas supply unit 74 at a certain flow rate, and an internal pressure of the chamber 10 is controlled to a preset value by the exhaust device 24. Further, the first and second high frequency power supplies 28 and 30 are powered on, and the first and second high frequency power supplies 28 and 30 output the first high frequency power HF and the second high frequency power LF at required power levels, respectively, and apply the high frequency powers HF and LF to the susceptor (lower electrode) 12 via the matching unit 32 and the power feed rod 34. Further, the heat transfer gas (e.g., a He gas) is supplied to the interface between the electrostatic chuck 38 and the semiconductor wafer W from the heat transfer gas supply unit. Further, by turning on the switch 46 for the electrostatic chuck, the heat transfer gas is confined into the interface between the electrostatic chuck 38 and the semiconductor wafer W by an electrostatic attracting force. Meanwhile, by turning on the heater power supplies 58(IN) and 58(OUT), Joule heats are generated by the inner heating wire 40(IN) and the outer heating wire 40(OUT), respectively, so that the temperature or a temperature distribution of the top surface of the susceptor 12 can be controlled to a preset value. The etching gas discharged from the shower head 64 is excited into plasma by a high frequency discharge between the susceptor 12 and the shower head 64 (i.e., between the two facing electrodes). A processing target film on the surface of the semiconductor wafer W is etched to have a required pattern by radicals or ions in the plasma.

In this capacitively coupled plasma etching apparatus, by applying the first high frequency power HF having a relatively higher frequency (desirably, equal to or higher than 60 MHz) suitable for plasma generation to the susceptor 12, plasma can be highly densified in a desirably dissociated state. Accordingly, high-density plasma can be generated under a lower pressure condition. Further, by applying the second high frequency power LF having a relatively lower frequency (equal to or lower than 13 MHz) suitable for ion attraction to the susceptor 12, an anisotropic etching process having high selectivity can be performed on the semiconductor wafer W mounted on the susceptor 12.

Moreover, in this capacitively coupled plasma etching apparatus, the susceptor 12 is cooled by the chiller unit and heated by the heater, and the heating by the heater is controlled independently at the central region and the peripheral region of the susceptor 12 in the radial direction thereof. Thus, the temperature can be changed and increased or decreased rapidly at a high speed, and profile of the temperature distribution can be controlled as required or in various ways.

<Circuit Configuration within Filter Unit>

Now, a circuit configuration within the filter units 54(IN) and 54(OUT) in this plasma etching apparatus will be explained.

Figure 2:
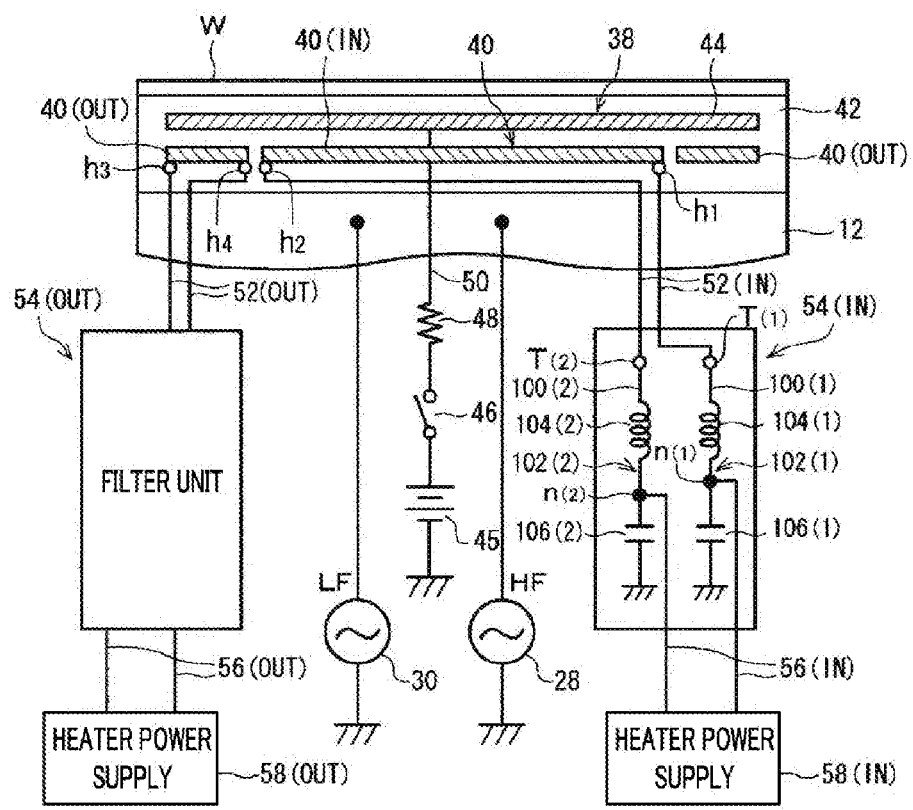
FIG. 2 is a diagram illustrating a circuit configuration of a heater power supply unit configured to apply a power to a heating element of a susceptor in the exemplary embodiment.

FIG. 2 illustrates circuit configurations of heater power supply units configured to apply a power to the heating element 40 provided in the susceptor 12. In this exemplary embodiment, the heater power supply units having the substantially same circuit configuration are connected to the inner heating wire 40(IN) and the outer heating wire 40(OUT) of the heating element 40, respectively. With this configuration, heating amounts or heating temperatures of the inner heating wire 40(IN) and the outer heating wire 40(OUT) can be controlled individually. In the following description, a configuration and an operation of the heater power supply unit for the inner heating wire 40(IN) will be elaborated. The heater power supply unit for the outer heating wire 40(OUT) has the completely same configuration and operation.

The heater power supply 58(IN) is an AC output power supply that performs a switching (ON/OFF) operation for a commercial frequency by using, e.g., SSR (Solid State Relay). The heater power supply 58(IN) is connected with the inner heating wire 40(IN) in a closed-loop circuit. To elaborate, a first output terminal of a pair of output terminals of the heater power supply 58(IN) is electrically connected to a first terminal $h_1$ of the inner heating wire 40(IN) via a first power feed line (power cable) 100(1), and a second output terminal thereof is electrically connected to a second terminal $h_2$ of the inner heating wire 40(IN) via a second power feed line (power cable) 100(2).

The filter unit 54(IN) includes a first filter 102(1) and a second filter 102(2) provided on the way of the first heater power feed line 100(1) and the second heater power feed line 100(2), respectively. These two filters 102(1) and 102(2) have the substantially same circuit configurations.

To be more specific, the filters 102(1) and 102(2) have solenoid coils 104(1) and 104(2) that are grounded via capacitors 106(1) and 106(2), respectively. Filter terminals T(1) and T(2) or one terminals of the solenoid coils 104(1) and 104(2) are connected to the terminals $h_1$ and $h_2$ of the inner heating wire 40(IN) via the pair of power feed conductors 52(IN), respectively. The capacitors 106(1) and 106(2) are connected between the other terminals of the solenoid coils 104(1) and 104(2) and a conductive member having a ground potential (e.g., the chamber 10). Connection points n(1) and n(2) between the solenoid coils 104(1) and 104(2) and the capacitors 106(1) and 106(2) are connected to the first and second output terminals of the heater power supply 58(IN) via the electric cables (pair cables) 56(IN), respectively.

In the heater power supply unit having the above-described configuration, during a positive cycle, an electric current outputted from the heater power supply 58(IN) may flow from the first terminal $h_1$ to the inner heating wire 40(IN) through the first power feed line 100(1), i.e., through the electric cable 56(IN), the solenoid coil 104(1) and the power feed conductor 52(IN), so that each part of the inner heating wire 40(IN) generates Joule heat. Then, after flowing from the second terminal $h_2$, the electric current is returned back through the second power feed line 100(2), i.e., through the power feed conductor 52(IN), the solenoid coil 104(2) and the electric cable 56(IN). During a negative cycle, the electric current flows through the same circuit in the reverse direction to that stated above. Since the electric current of this AC output from the heater has a commercial frequency, impedance of the solenoid coils 104(1) and 104(2) or voltage drops thereof may be negligibly small, and the amount of a leakage current flowing to the earth through the capacitors 106(1) and 106(2) may also be negligibly small.

Physical Configuration within Filter Unit (First Exemplary Embodiment)

Figure 4A:
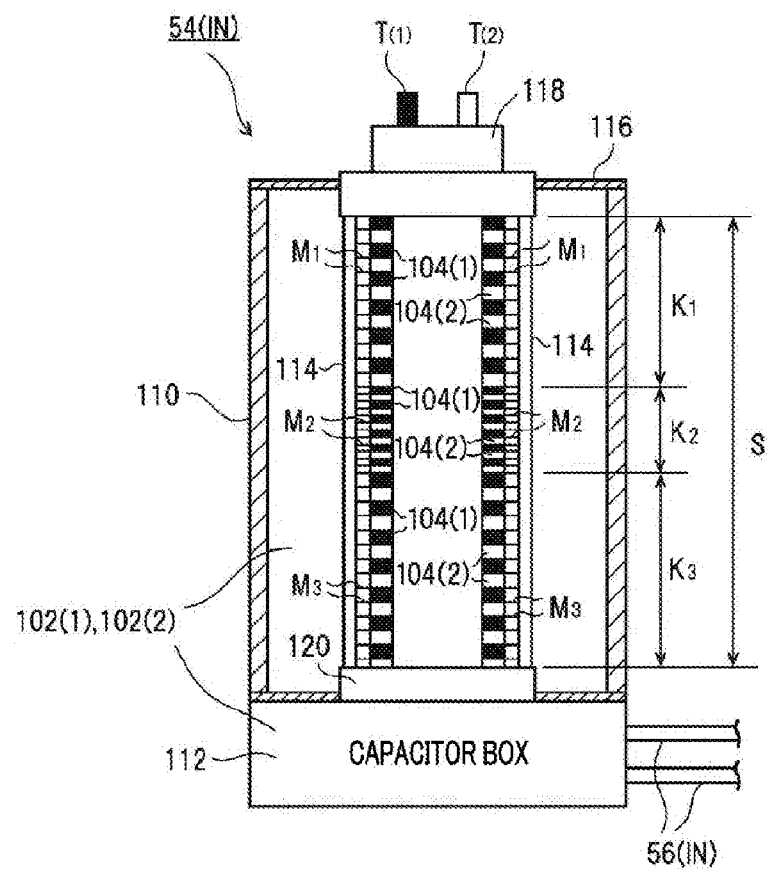
FIG. 4A is a longitudinal cross sectional view illustrating a structure of a filter unit according to a first exemplary embodiment.
Figure 4B:
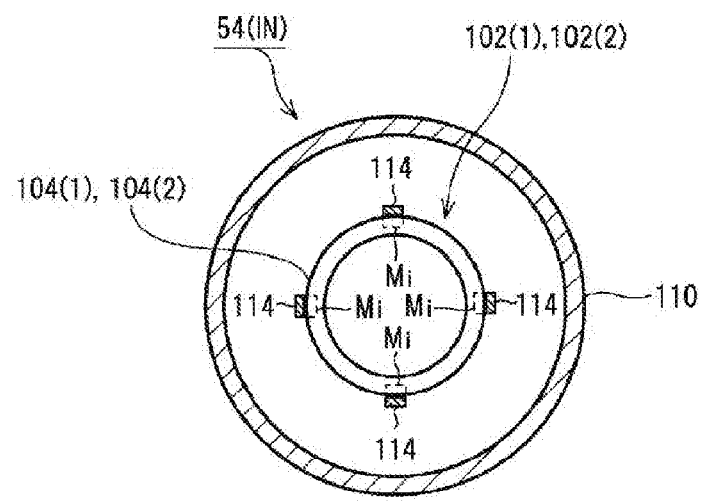
FIG. 4B is a horizontal cross sectional view illustrating the structure of the filter unit.
Figure 5:
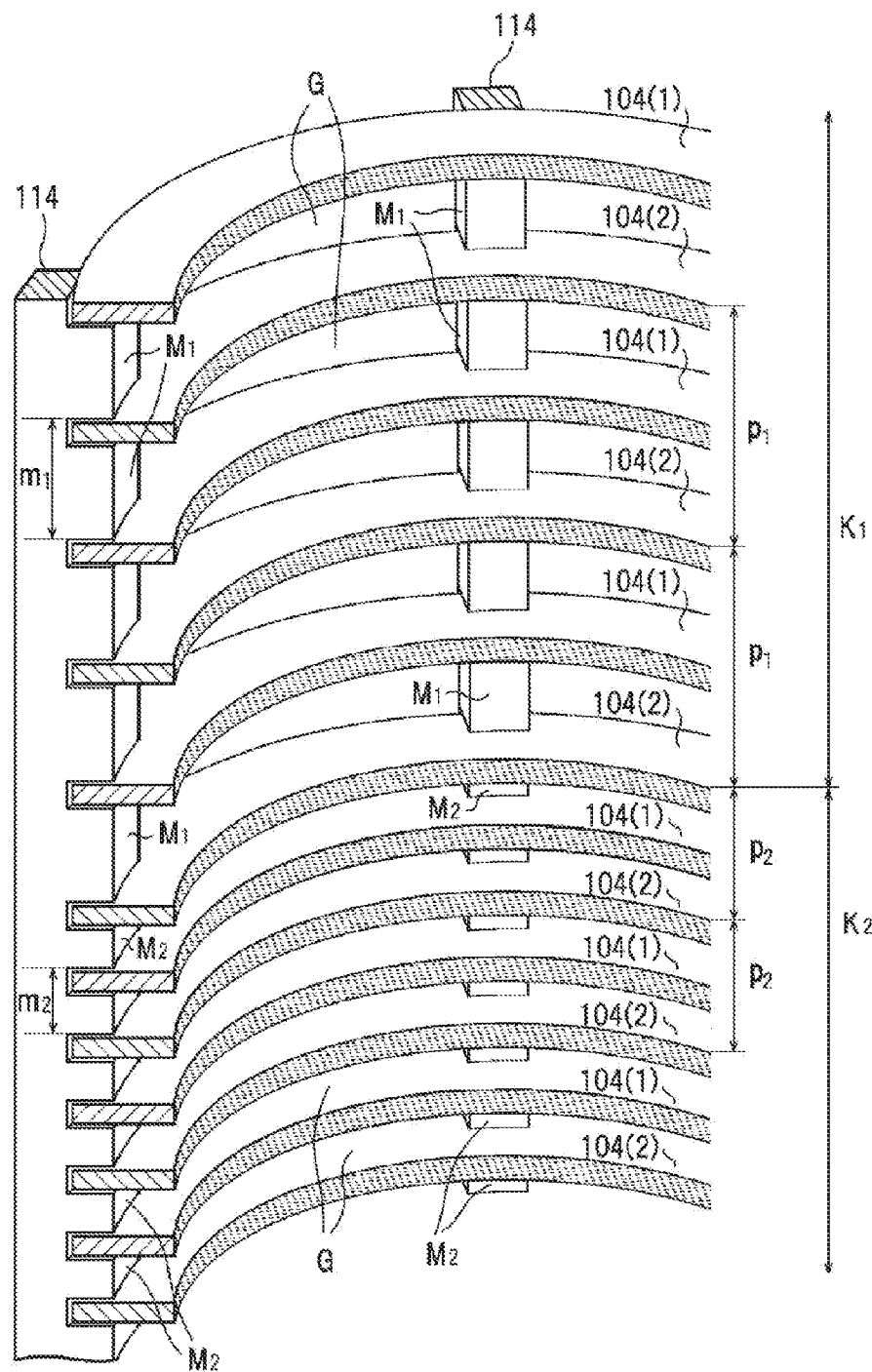
FIG. 5 is a partially enlarged perspective view illustrating a configuration of major parts of the filter unit.

FIG. 4A, FIG. 4B and FIG. 5 illustrate a physical structure within the filter unit 54(IN) in accordance with a first example embodiment. The filter unit 54(IN) includes, as depicted in FIG. 4A and FIG. 4B, a cylindrical outer conductor 110 made of, but not limited to, aluminum, in which the solenoid coil 104(1) of the first filter 102(1) and the solenoid coil 104(2) of the second filter 102(2) are arranged coaxially. Further, the filter unit 54(IN) also includes a capacitor box 112 which is made of, but not limited to, aluminum and provided at the opposite side from the filter terminals T(1) and T(2). In the capacitor box 112, the capacitor 106(1) of the first filter 102(1) and the capacitor 106(2) of the second filter 102(2) (FIG. 2) are accommodated. The outer conductor 110 is screw-coupled to a conductive member of a ground potential, for example, the chamber 10.

Each of the solenoid coils 104(1) and 104(2) is formed of an air core coil. Further, each of the solenoid coils 104(1) and 104(2) has a thick coil wire or coil conductor and a large coil size (e.g., a diameter of 22 mm to about 45 mm and a length of about 130 mm to about 280 mm). With this configuration, each of the solenoid coils 104(1) and 104(2) may serve as a power feed line through which a sufficiently large electric current (e.g., about 30 A) flows into the inner heating wire 40(IN) from the heater power supply 58(IN), and further, may obtain very large inductance and a large line length with the air core without having a magnetic core such as ferrite for the purpose of suppressing heat generation (power loss).

Within the cylindrical outer conductor 110, the two solenoid coils 104(1) and 104(2) stand uprightly on the capacitor box 112 by being supported by a coil supporting shaft (not shown) which is made of an insulator, e.g., a resin. The coil conductor of each of the solenoid coils 104(1) and 104(2) is spirally wound at a variable winding pitch p in multiple stages in a substantially bare wire state without being covered with a coil sleeve, and has the same coil length S.

In the vicinity of the solenoid coils 104(1) and 104(2), a multiple number of, e.g., four rod-shaped comb-teeth members 114, which are extended in parallel to a coil axis direction, are provided adjacent to the outer periphery of the solenoid coils 104(1) and 104(2) at a regular interval in a circumferential direction thereof. Each comb-teeth member 114 is made of a resin having high hardness, processibility and heat resistance, such as, but not limited to, an insulator, e.g., PEEK or PCTFE, and is fixed in the filter unit 54(IN) independently from the solenoid coils 104(1) and 104(2).

As depicted in FIG. 5, comb teeth M are formed on an inner surface of each comb-teeth member 114, and the comb teeth M are inserted (fitted) into respective winding gaps of the solenoid coils 104(1) and 104(2). From another viewpoint, the coil conductor of each of the solenoid coils 104(1) and 104(2) is inserted into each of slits between every two adjacent comb teeth M. Accordingly, a winding pitch p of each of the two solenoid coils 104(1) and 104(2) is determined according to a pitch m of the comb teeth M. In this exemplary embodiment, since the two solenoid coils 104(1) and 104(2) are spirally wound while being overlapped, the winding pitch p of each of the solenoid coils 104(1) and 104(2) is twice the pitch m of the comb teeth M. That is, a relationship of p=2 m is established.

The winding pitch p of the solenoid coils 104(1) and 104(2) is not regular (constant) from one end to the other end of each coil in the coil axis direction, but is set or adjusted independently in each section. That is, regarding the winding pitch p, each of the solenoid coils 104(1) and 104(2) is divided to multiple sections $K_1$, $K_2$, . . . in the coil axis direction, and, basically, a winding pitch $p_i$ in each section $K_i$ (i=1, 2, . . . ) is set independently. Thus, regarding the comb-teeth pitch m, each of the comb-teeth members 114 is also divided to the same multiple sections $K_1$, $K_2$, . . . as those in case of the winding pitch p, and a comb-teeth pitch $m_i$ in each section $K_i$ is set independently.

FIG. 4A illustrates an example where the solenoid coils 104(1) and 104(2) are divided to three sections $K_1$, $K_2$ and $K_3$. In this three-division pattern, typically, a winding pitch $p_1$ in the first section $K_1$ closest to the inlet of the filter unit 54(IN), i.e., the filter terminals T(1) and T(2), and a winding pitch $p_3$ in the third section $K_3$ farthest from the inlet of the filter unit 54(IN) are set to be same. On the other hand, a winding pitch $p_2$ in the intermediate second section $K_2$ is set to be much smaller (desirably, ½ or less) than the other winding pitches $p_1$ and $p_3$, or, reversely, to be much larger (desirably, twice or more) than the other winding pitches $p_1$ and $p_3$. That is, a variable-winding-pitch structure having two levels is employed. In the winding pitch $p_1$, the influence degree of a distance between electrodes with respect to a capacitance of a capacitor is proportional to $1/p_1$, it is effective to set the winding pitch $p_2$ to be ½ of the winding pitches $p_1$ and $p_3$ or less, or to be at least twice the winding pitches $p_1$ and $p_3$.

Effects and operations in the technique of dividing the solenoid coils 104(1) and 104(2) to multiple sections $K_1$, $K_2$, . . . regarding the winding pitch p and setting or adjusting the winding pitch $p_i$ in each section $K_i$ independently will be elaborated later in detail.

An annular cover body 116 and an upper connector 118 made of a resin are provided at an upper opening of the outer conductor 110. Upper ends of the aforementioned non-illustrated coil supporting shaft and the comb-teeth members 114 are coupled to the upper connector 118. Further, upper ends of the solenoid coils 104(1) and 104(2) are electrically connected to the filter terminals T(1) and T(2), respectively, within or in the vicinity of the upper connector 118.

A lower connector 120 is provided on a top surface of the capacitor box 112, and lower ends of the aforementioned coil supporting shaft and the comb-teeth members 114 are coupled to the lower connector 120. Further, lower ends of the solenoid coils 104(1) and 104(2) are connected to the connection points n(1) and n(2) and the capacitors 106(1) and 106(2) (FIG. 2), respectively, within or in the vicinity of the lower connector 120.

Further, a multiple number of vent holes (not shown) for air-cooling the solenoid coils 104(1) and 104(2) accommodated in the outer conductor 110 are formed at the outer conductor 110 by, for example, a punching process.

Figure 6A:
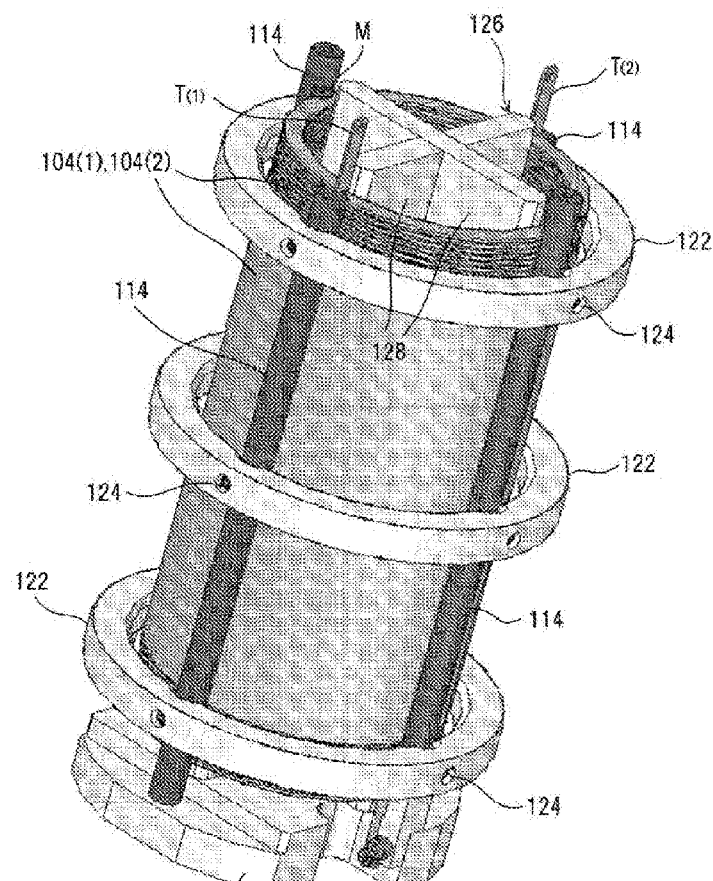
FIG. 6A is a perspective view illustrating a specific configuration example of a sub-assembly around a solenoid coil in the filter unit.
Figure 6B:
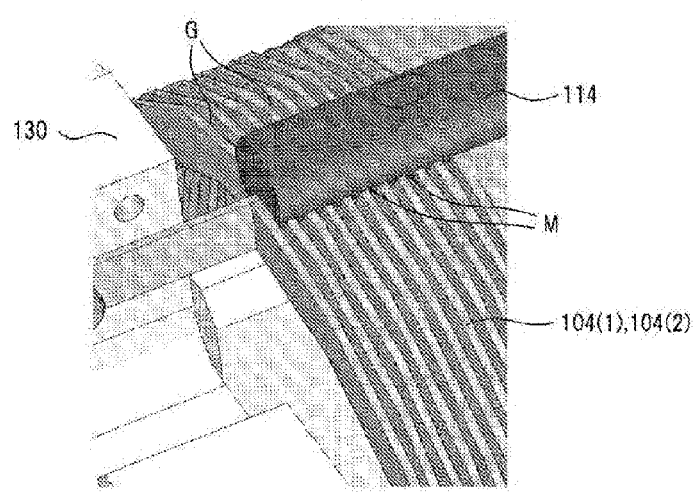
FIG. 6B is a partially enlarged perspective view illustrating major parts of the sub-assembly.

FIG. 6A and FIG. 6B depict a configuration of a sub-assembly the vicinity of the solenoid coils 104(1) and 104(2) in the present exemplary embodiment. As illustrated, the multiple (four) rod-shaped comb-teeth members 114 are coupled by bolts 124 to a ring-shaped supporting body 122, which is made of, for example, a resin and surrounds the comb-teeth members 114 at multiple positions (three positions at both end portions and at an intermediate portion) in an axis direction. The comb teeth M formed on the inner surface of each comb-teeth member 114 are inserted (fitted)

into the winding gaps of the solenoid coils 104(1) and 104(2). Accordingly, the winding pitch p of the solenoid coils 104(1) and 104(2) corresponds to the pitch m of the comb teeth M in a relationship of p=2 m, and air gaps G corresponding to the thickness of the comb teeth M are formed in winding gaps of the coils except where the comb teeth M are inserted.

A coil supporting shaft 126 having, for example, a cross-shaped cross section is inserted into the solenoid coils 104(1) and 104(2). This coil supporting shaft 126 is formed of a multiple number of plate-shaped members 128 which are made of an insulator, e.g., a resin and are radially extended in a coil radial direction to come into contact with inner peripheral surfaces of the solenoid coils 104(1) and 104(2) and, also, extended in parallel to the solenoid coils 104(1) and 104(2) in the coil axis direction. Further, in FIG. 6A and FIG. 6B, a block 130 that holds the coil supporting shaft 126, the comb-teeth members 114, and so froth at one end side of the solenoid coils 104(1) and 104(2) is a jig configured to assemble this sub-assembly.

Figure 7:
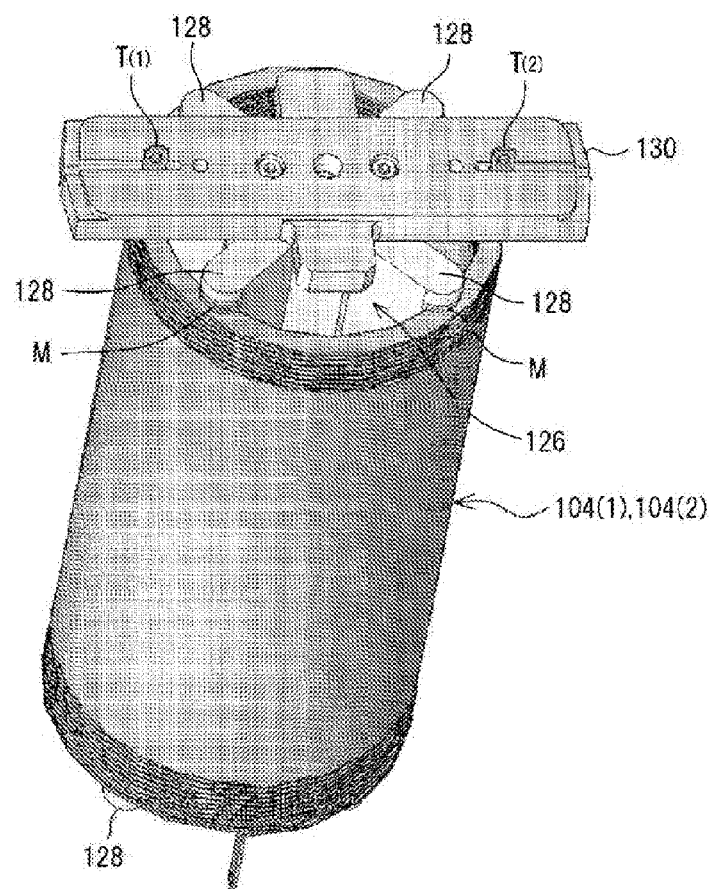
FIG. 7 is a perspective view illustrating a modification example of the specific configuration of the sub-assembly.

FIG. 7 illustrates a structure of a sub-assembly in the vicinity of the solenoid coils 104(1) and 104(2) according to a modification example. In this modification example, comb teeth M are formed at outer end surfaces of the plate-shaped members 128 forming the coil supporting shaft 126. The comb teeth M of the plate-shaped members 128 are inserted (fitted) into the winding gaps of the solenoid coils 104(1) and 104(2) from the inside thereof in the coil radial direction, and define the winding pitch p with a relationship of p=2m. In this structure, since the plate-shaped members 128 forming the coil supporting shaft 126 also serve as the comb-teeth members, the aforementioned rod-shaped comb-teeth members 114 need not be provided in the vicinity of the solenoid coils 104(1) and 104(2).

As another modification example, the comb-teeth M are formed with a preset pitch m at the outer end surfaces of the plate-shaped members 128 provided within the solenoid coils 104(1) and 104(2) as shown in FIG. 7, and the rod-shaped comb-teeth members 114 having, on the inner surfaces thereof, the comb teeth M formed with the same pitch m as shown in FIG. 6A are arranged in the vicinity of the solenoid coils 104(1) and 104(2). That is, it is possible to adopt a configuration in which the comb teeth M are inserted (fitted) into the winding gaps of the solenoid coils 104(1) and 104(2) at different positions in the circumferential direction from both the inner side and the outer side in the coil radial direction. Furthermore, as still another modification example, it may be also possible to adopt a configuration in which a multiple number of rod-shaped comb-teeth members 114 are provided within the solenoid coils 104(1) and 104(2), and the comb teeth M formed at the outer surfaces of the respective comb-teeth members 114 are inserted into the winding gaps of the solenoid coils 104(1) and 104(2).

Operation of Filter Unit (First Exemplary Example)

In the filter unit 54(IN) in accordance with the present exemplary embodiment, a distributed constant line is formed between the solenoid coils 104(1) and 104(2) of the first and second filters 102(1) and 102(2) and the outer conductor 110.

In general, characteristic impedance $Z_o$ of a transmission line is expressed as $Z_o=\sqrt{(L/C)}$ by using electrostatic capacitance C per a unit length and inductance L per a unit length when no loss is assumed. Further, a wavelength λ is calculated by the following equation.

$$\lambda=2\pi/(\omega\sqrt{(LC)}) \qquad (1)$$

Unlike in a general distributed constant line (especially, in a coaxial line) where a rod-shaped cylindrical conductor serves as the central portion of the transmission line, the cylindrical solenoid coils serve as a central conductor in the filter unit 54(IN). It is assumed that the inductance L per a unit length is mainly caused by the cylindrical coil. Meanwhile, the electrostatic capacitance per a unit length is defined as electrostatic capacitance C of a capacitor formed by a coil surface and the outer conductor. In this filter unit 54(IN), when the inductance per a unit length and the electrostatic capacitance per a unit length are L and C, respectively, it is assumed that a distributed constant line of which characteristic impedance $Z_o$ is expressed as $Z_o=\sqrt{(L/C)}$ is formed.

When the filter unit having this distributed constant line is viewed from the side of the terminal T, since an opposite side thereof is nearly short-circuited by the capacitor having large capacitance (e.g., about 5000 pF), there may be obtained a frequency-impedance characteristic in which large impedance is repeated at a constant frequency interval. This impedance characteristic may be obtained when the wavelength and the length of the distributed line are same.

In this filter unit 54(IN), not a winding length of the solenoid coils 104(1) and 104(2) but a coil length S in the axis direction (FIG. 4A) becomes the length of the distributed line. By using the solenoid coils 104(1) and 104(2) as the central conductor, L can be increased to be much larger than that in case of using a rod-shaped cylindrical conductor as the central conductor, so that λ can be reduced. Thus, it is possible to realize an effective length that is a comparatively short line length (coil length S) and is equal to or larger than the wavelength. Further, it is possible to obtain an impedance characteristic in which large impedance is repeated at a comparatively short frequency interval.

Figure 8:
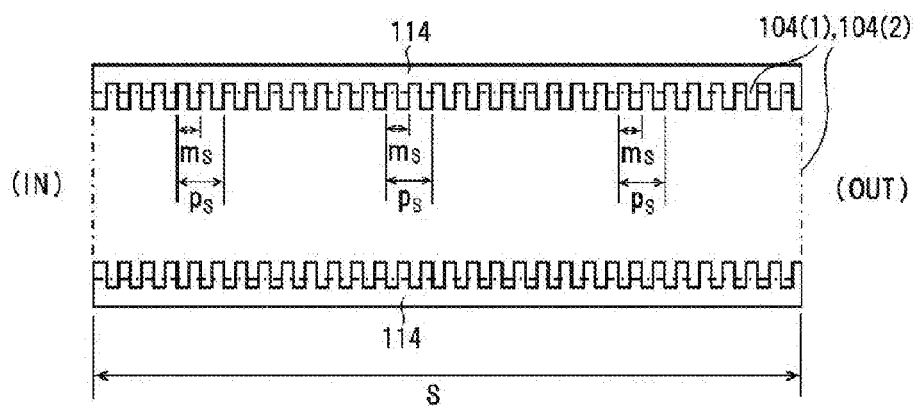
FIG. 8 is a diagram showing a comparison reference regarding a winding pitch of a solenoid coil in the first exemplary embodiment.

In the distributed constant line having the above-described configuration, if the winding pitch of the solenoid coils 104(1) and 104(2) is uniform (constant value $p_s$) over the entire length S of the solenoid coils 104(1) and 104(2) as shown in FIG. 8, a frequency-impedance characteristic of multiple parallel resonance in which impedance increases in a conical shape at a regular frequency interval is obtained. Accordingly, if a frequency of a high frequency noise introduced to the power feed lines 100(1) and 100(2) through the susceptor 12 and the heating element 40 is designed to be equal to or approximate to any one parallel resonance frequency of the multiple parallel resonance, such a high frequency noise can be effectively blocked by the filter unit 54(IN), and the heater power supply 58(IN) can be protected from the high frequency noise stably and securely.

As in the plasma processing apparatus of the present exemplary embodiment, however, when multiple high frequency powers (first high frequency power HF and second high frequency power LF) of different frequencies are applied to the susceptor 12, two parallel resonance frequencies of the multiple parallel resonance need to be matched (be equal to or approximate to) with the frequencies of the multiple high frequency powers HF and LF at the same time. In such a case, in the aforementioned filter configuration where the winding pitch of the solenoid coils 104(1) and 104(2) is uniform (constant value $p_s$) over the entire length S, since the parallel resonance frequencies are obtained at a regular frequency interval, it is very difficult to match the multiple parallel resonance with the frequencies of the two high frequency powers HF and LF at the same time, which are selected in consideration of various aspects such as the kind or specification of a process involved.

To solve this problem, in the prior art described in Patent Document 1, by providing a ring-shaped member between the solenoid coils 104(1) and 104(2) and the outer conductor 110 in the filter unit 54(IN), the gap of the coaxial line is narrowed locally. Accordingly, C (electrostatic capacitance per a unit length) is changed, and, also, the characteristic impedance $Z_o = \sqrt{(L/C)}$ is changed locally. Thus, a part or all of resonance frequencies of the multiple parallel resonance may be shifted.

In contrast, in the filter unit 54(IN) according to the present exemplary embodiment, instead of providing such a ring-shaped member, a physical characteristic of the solenoid coils 104(1) and 104(2), which determines C and/or L of the coaxial line, is set or adjusted independently for each of the multiple sections $K_1, K_2, \ldots$. Thus, the characteristic impedance $Z_o = \sqrt{(LC)}$ is changed in each section without changing the gap of the coaxial line, so that a part or all of resonance frequencies of the multiple parallel resonance can be shifted.

In this first exemplary embodiment, regarding the winding pitch p, by dividing the solenoid coils 104(1) and 104(2) to the multiple sections $K_1, K_2, \ldots$, and by setting or adjusting the winding pitch $p_i$ in each section $K_i$ independently, C and L of the coaxial line are changed in each section, so that the characteristic impedance $Z_o = \sqrt{(LC)}$ is changed in each section. Thus, a part or all of the resonance frequencies of the multiple parallel resonance can be shifted. In this case, in each section $K_i$, as the winding pitch p of the solenoid coils 104(1) and 104(2) is decreased, C and L per a unit length are increased, so that the characteristic impedance $Z_o = \sqrt{(LC)}$ is increased. On the contrary, as the winding pitch p of the solenoid coils 104(1) and 104(2) is increased, C and L per a unit length are decreased, so that the characteristic impedance $Z_o = \sqrt{(LC)}$ is decreased.

To verify effects of the above-described technique according to the first exemplary embodiment, the present inventor has acquired, by the electromagnetic field computation, the frequency-impedance characteristics of the first filter 102(1) including the solenoid coil 104(1) the each of five division patterns $A_1$ to $A_5$ where a winding pitch of one section having a length of S/5 is set to be ½ of a winding pitch of the other section or the other sections having a length of 4S/5 alone or in total. Then, the frequency-impedance characteristic acquired for each division pattern $A_n$ (n=1~5) is compared with a frequency-impedance characteristic obtained by the electromagnetic field computation for a configuration (comparison reference $A_s$) where a solenoid coil is not divided to several sections, i.e., a winding pitch is set to be constant ($p_s$) from one end of the coil to the other end thereof, as illustrated in FIG. 8. Further, since the second filter 102(2) including the solenoid coil 104(2) has the same configuration as that of the first filter 102(1), the frequency-impedance characteristics of the second filter 102(2) have substantially the same as those of the first filter 102(1).

Figure 9A:
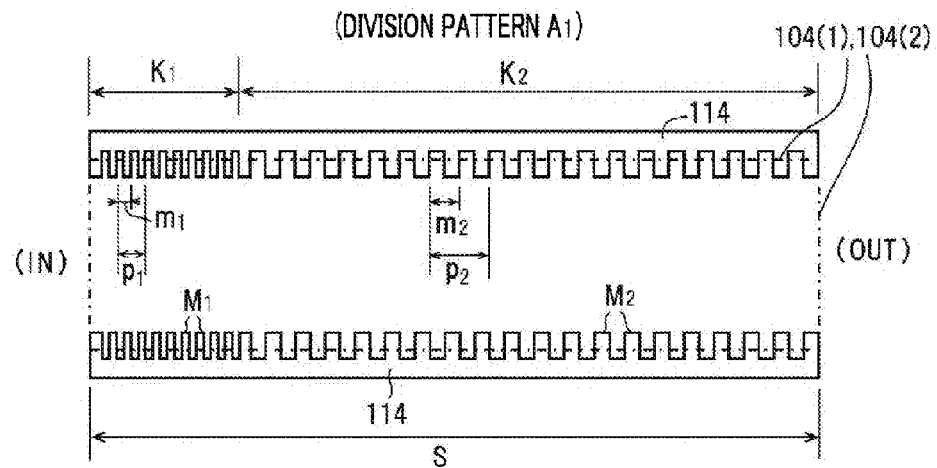
FIG. 9A is a diagram showing a first division pattern regarding a winding pitch of a solenoid coil in the first exemplary embodiment.

In a first division pattern $A_1$, as shown in FIG. 9A, the solenoid coils 104(1) and 104(2) are divided to two sections $K_1$ and $K_2$ at a length ratio of 1:4 from an inlet (IN) of the filter unit 54(IN) toward an outlet (OUT) thereof, and a ratio between winding pitches $p_1$ and $p_2$ of the two sections $K_1$ and $K_2$ is set to be 1:2. In this case, with respect to the winding pitch $p_s$ in the comparison reference $A_s$ (FIG. 8), by setting $p_1=0.56\ p_s$ and $p_2=1.12\ p_s$, the entire length S of the coil can be maintained the same as that of the comparison reference $A_s$ (FIG. 8).

Figure 9B:
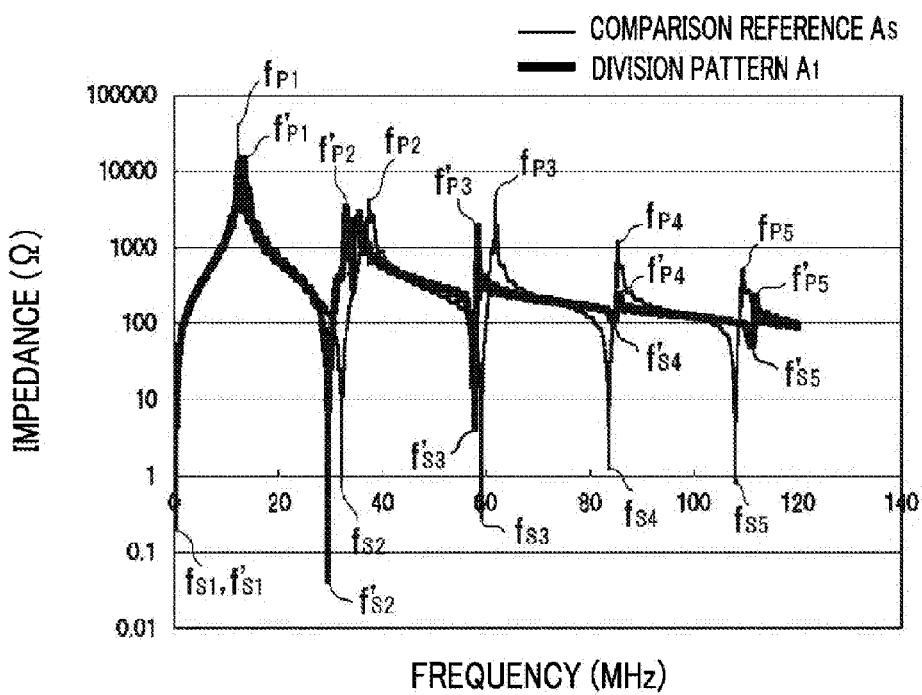
FIG. 9B is a diagram showing a frequency-impedance characteristic of the first division pattern in comparison with a frequency-impedance characteristic of the comparison reference (FIG. 8).

FIG. 9B depicts a frequency-impedance characteristic in the first division pattern $A_1$ (FIG. 9A) in comparison with the frequency-impedance characteristic in the comparison reference $A_s$ (FIG. 8). As shown therein, second serial/parallel resonance frequencies and third serial/parallel resonance frequencies are shifted to lower frequency ranges ($f_{s2} > f'_{s2}$), ($f_{p2} > f'_{p2}$), ($f_{s3} > f'_{s3}$), ($f_{p3} > f'_{p3}$), respectively, and fifth serial/parallel resonance frequencies are shifted to a higher frequency range ($f_{s5} < f'_{s5}$), ($f_{p5} < f'_{p5}$).

By way of example, assume that the frequency of the first high frequency power HF is 60 MHz. In the frequency-impedance characteristic of the comparison reference $A_s$ (FIG. 8), since a third serial resonance frequency $f_{s3}$ is about 60 MHz, impedance corresponding to this frequency is very low as 10Ω or below. As a result, it is difficult to completely block a noise of the first high frequency power HF in the filter unit 54(IN). However, if the first division pattern $A_1$ (FIG. 9A) is used instead of the comparison reference $A_s$, a third serial resonance frequency $f'_{s3}$ is shifted to about 57 MHz and a third parallel resonance frequency $f'_{p3}$ is located about 60 MHz. As a result, a noise of the first high frequency power HF can be securely blocked with high impedance equal to or higher than several hundreds of angstroms (Ω).

Figure 10A:
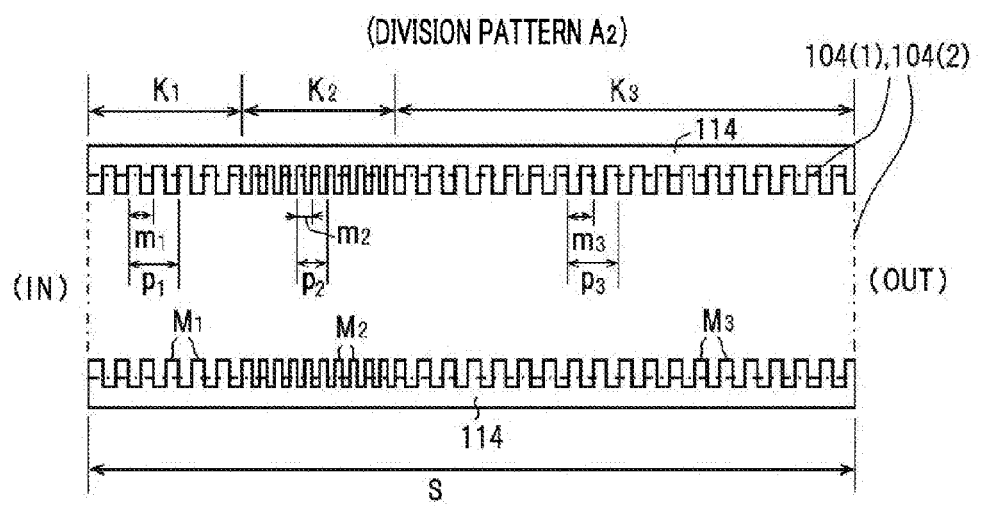
FIG. 10A is a diagram showing a second division pattern in the first exemplary embodiment.

In a second division pattern $A_2$, as shown in FIG. 10A, the solenoid coils 104(1) and 104(2) are divided to three sections $K_1, K_2$ and $K_3$ at a length ratio of 1:1:3 from the inlet (IN) toward the outlet (OUT), and a ratio between winding pitches $p_1, p_2$ and $p_3$ of the three sections $K_1, K_2$ and $K_3$ is set to be 2:1:2. In this case, by setting $p_1=1.12\ p_s$, $p_2=0.56\ p_s$ and $p_3=1.12\ p_s$, the entire coil length S can be maintained the same as that of the comparison reference $A_s$ (FIG. 8).

Figure 10B:
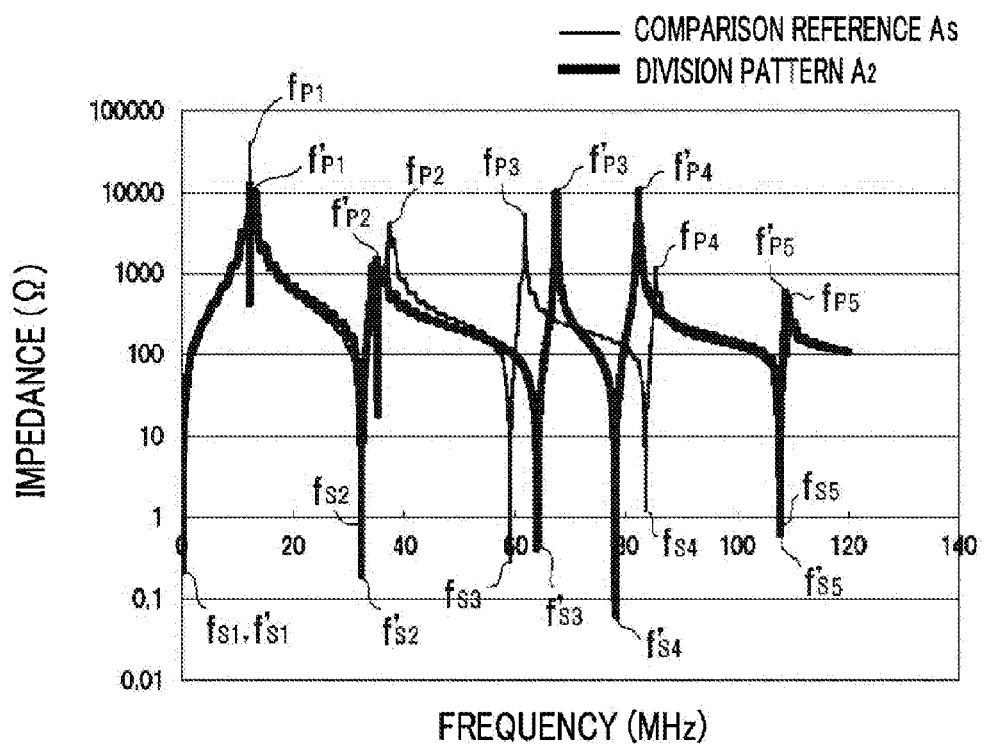
FIG. 10B is a diagram showing a frequency-impedance characteristic of the second division pattern in comparison with the frequency-impedance characteristic of the comparison reference (FIG. 8).

FIG. 10B depicts a frequency-impedance characteristic of the second division pattern $A_2$ (FIG. 10A) in comparison with the frequency-impedance characteristic of the comparison reference $A_s$ (FIG. 8). As shown therein, second serial/parallel resonance frequencies and fourth serial/parallel resonance frequencies are shifted to lower frequency ranges ($f_{s2} > f'_{s2}$), ($f_{p2} > f'_{p2}$), ($f_{s4} > f'_{s4}$), ($f_{p4} > f'_{p4}$), respectively, and third serial/parallel resonance frequencies are shifted to a higher frequency range ($f_{s3} < f'_{s3}$), ($f_{p3} < f'_{p3}$).

By way of example, assume that the frequency of the first high frequency power HF is 85 MHz. In the frequency-impedance characteristic of the comparison reference (FIG. 8), since a fourth serial resonance frequency $f_{s4}$ is about 84 MHz, impedance corresponding to this frequency is very low as 10Ω or below. As a result, it is difficult to completely block a noise of the first high frequency power HF in the filter unit 54(IN). However, if the second division pattern $A_2$ (FIG. 10A) is selected, a fourth serial resonance frequency $f'_{s4}$ is shifted to 80 MHz or less and a fourth parallel resonance frequency $f'_{p4}$ is located about 85 MHz. As a result, the noise of the first high frequency power HF can be securely blocked with high impedance equal to or higher than several hundreds of angstroms (Ω).

Figure 11A:
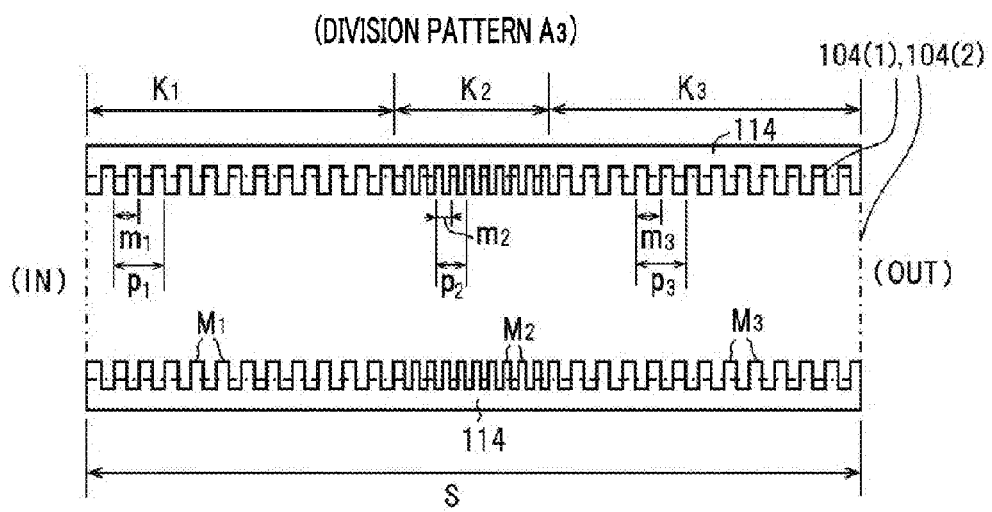
FIG. 11A is a diagram showing a third division pattern in the first exemplary embodiment.

In a third division pattern $A_3$, as shown in FIG. 11A, the solenoid coils 104(1) and 104(2) are divided to three sections $K_1, K_2$ and $K_3$ at a length ratio of 2:1:2 from the inlet (IN) toward the outlet (OUT). In this case, winding pitches $p_1, p_2$ and $p_3$ are also set to be $p_1=1.12\ p_s$, $p_2=0.56\ p_s$ and $p_3=1.12\ p_s$.

Figure 11B:
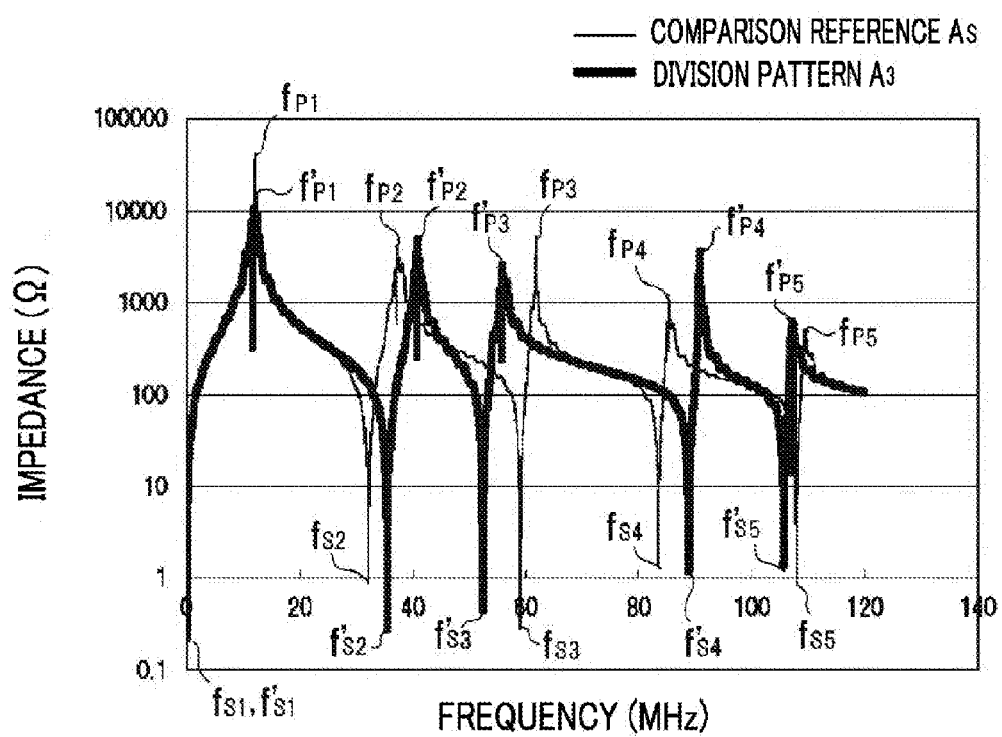
FIG. 11B is a diagram showing a frequency-impedance characteristic of the third division pattern in comparison with the frequency-impedance characteristic of the comparison reference (FIG. 8).

FIG. 11B depicts a frequency-impedance characteristic of the third division pattern $A_3$ (FIG. 11A) in comparison with the frequency-impedance characteristic of the comparison reference $A_s$ (FIG. 8). As shown therein, second serial/parallel resonance frequencies and fourth serial/parallel resonance frequencies are shifted to higher frequency ranges ($f_{s2} < f'_{s2}$), ($f_{p2} < f'_{p2}$), ($f_{s4} < f'_{s4}$), ($f_{p4} < f'_{p4}$), respectively, and third serial/parallel resonance frequencies and fifth serial/parallel resonance frequencies are shifted to lower frequency ranges ($f_{s3} > f'_{s3}$), ($f_{p3} > f'_{p3}$), ($f_{s5} > f'_{s5}$), ($f_{p5} > f'_{p5}$), respectively.

By way of example, assume that the frequency of the first high frequency power HF is 60 MHz. Even if the third division pattern $A_3$ is selected, since a third parallel resonance frequency $f'_{p3}$ (about 57 MHz) is approximate to the frequency (60 MHz) of the first high frequency power HF, the noise of the first high frequency power HF can also be securely blocked with high impedance equal to or higher than several hundreds of angstroms ($\Omega$).

Figure 12A:
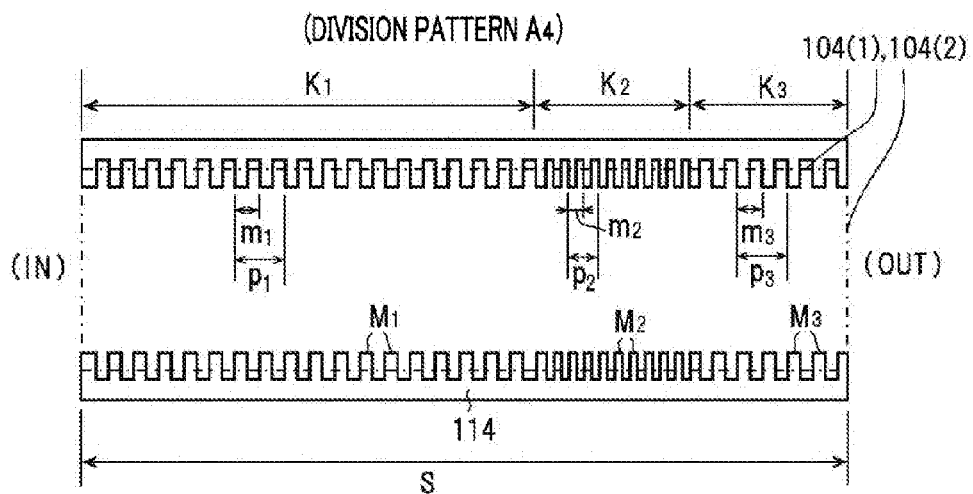
FIG. 12A is a diagram showing a fourth division pattern in the first exemplary embodiment.

In a fourth division pattern $A_4$, as shown in FIG. 12A, the solenoid coils 104(1) and 104(2) are divided to three sections $K_1$, $K_2$ and $K_3$ at a length ratio of 3:1:1 from the inlet (IN) toward the outlet (OUT). In this case, winding pitches $p_1$, $p_2$ and $p_3$ are also set to be $p_1 = 1.12\ p_s$, $p_2 = 0.56\ p_s$ and $p_3 = 1.12\ p_s$.

Figure 12B:
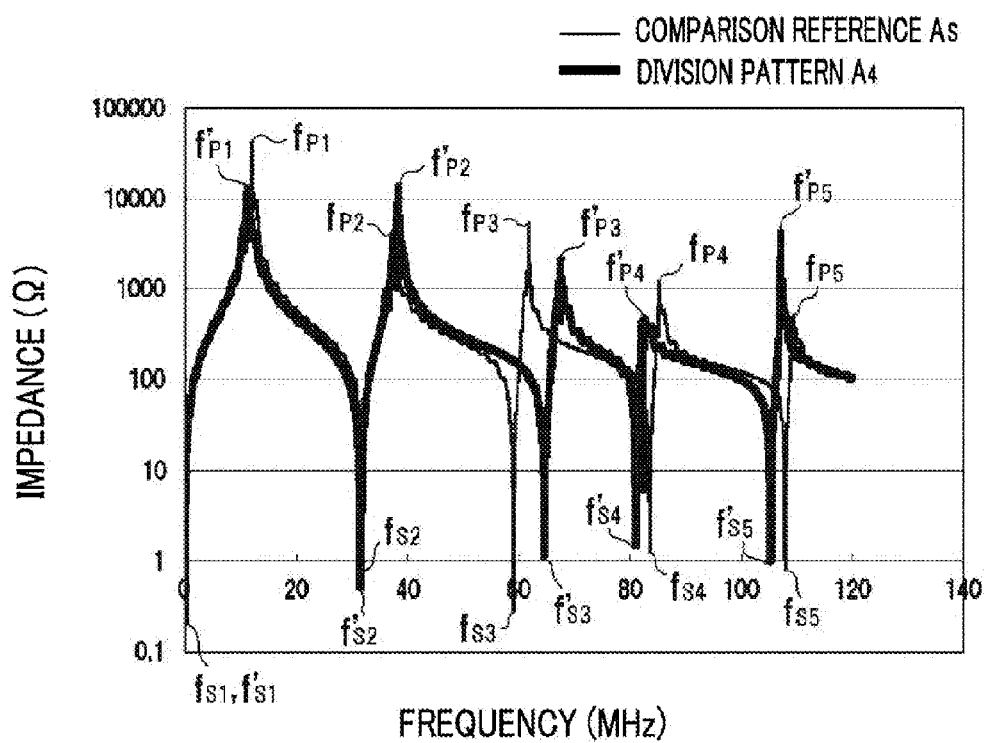
FIG. 12B is a diagram showing a frequency-impedance characteristic of the fourth division pattern in comparison with the frequency-impedance characteristic of the comparison reference (FIG. 8).

FIG. 12B depicts a frequency-impedance characteristic of the fourth division pattern $A_4$ (FIG. 12A) in comparison with the frequency-impedance characteristic of the comparison reference $A_s$ (FIG. 8). As shown therein, third serial/parallel resonance frequencies are shifted to a higher frequency range ($f_{s3} < f'_{s3}$), ($f_{p3} < f'_{p3}$), and fourth serial/parallel resonance frequencies and fifth serial/parallel resonance frequencies are shifted to lower frequency ranges ($f_{s4} > f'_{s4}$), ($f_{p4} > f'_{p4}$), ($f_{s5} > f'_{s5}$), ($f_{p5} > f'_{p5}$), respectively.

Particularly, in this fourth division pattern $A_4$, the third serial resonance frequency $f'_{s3}$ is shifted to 65 MHz or higher, and an interval between the third serial resonance frequency $f'_{s3}$ and a second parallel resonance frequency $f'_{p2}$ is increased. Accordingly, impedance of 100Ω or higher is obtained at 60 MHz. Thus, when the frequency of the first high frequency power HF is, for example, 60 MHz, even if the fourth division pattern $A_4$ is selected, the noise of the first high frequency power HF can also be securely blocked.

Figure 13A:
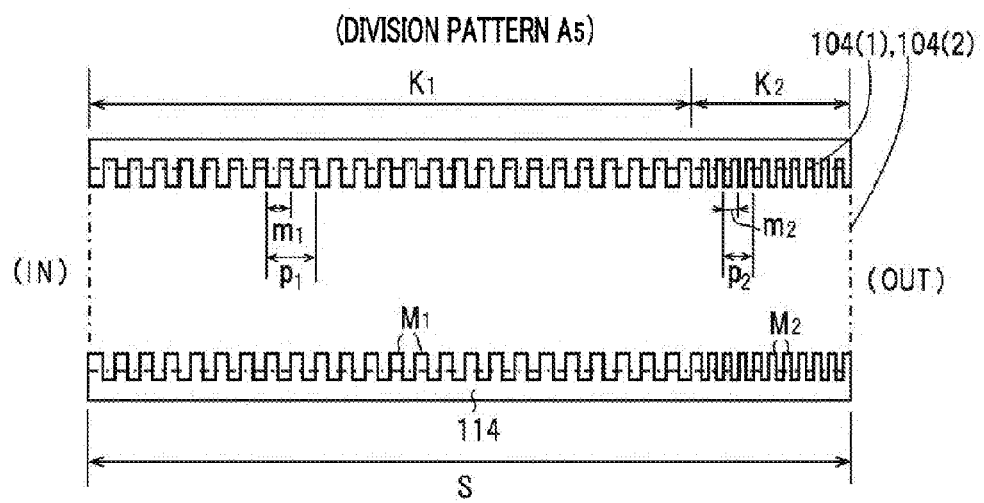
FIG. 13A is a diagram showing a fifth division pattern in the first exemplary embodiment.

In a fifth division pattern $A_5$, as shown in FIG. 13A, the solenoid coils 104(1) and 104(2) are divided to two sections $K_1$, and $K_2$ at a length ratio of 4:1 from the inlet (IN) toward the outlet (OUT). In this case, winding pitches $p_1$ and $p_2$ are set to be $p_1 = 1.12\ p_s$, and $p_2 = 0.56\ p_s$.

Figure 13B:
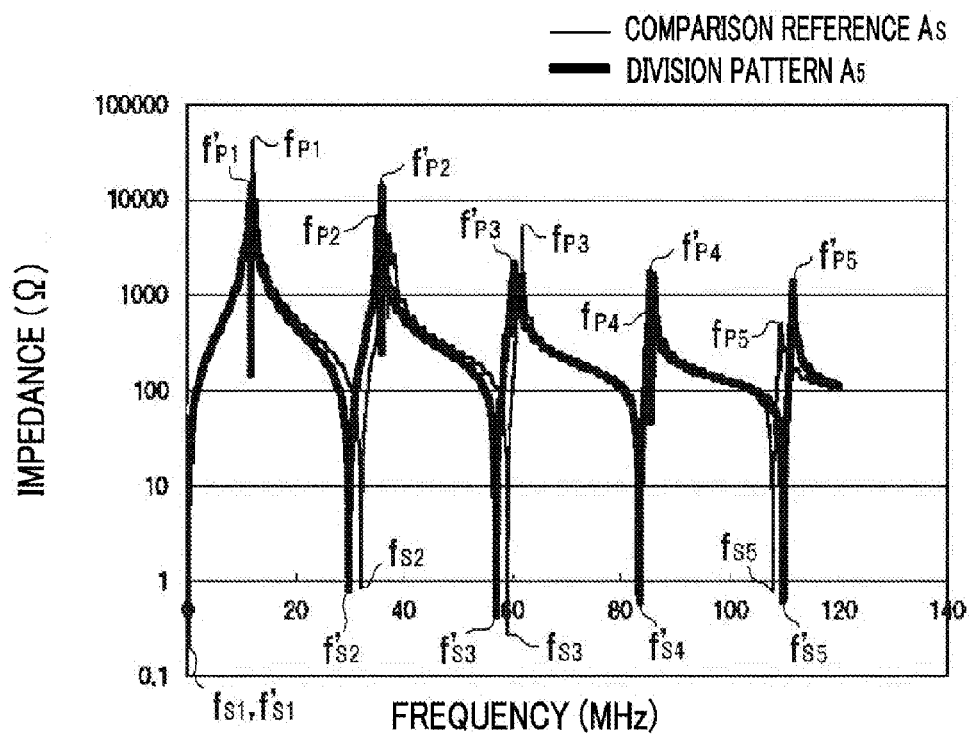
FIG. 13B is a diagram showing a frequency-impedance characteristic of the fifth division pattern in comparison with the frequency-impedance characteristic of the comparison reference (FIG. 8).

FIG. 13B depicts a frequency-impedance characteristic of the fifth division pattern $A_5$ (FIG. 13A) in comparison with the frequency-impedance characteristic of the comparison reference $A_s$ (FIG. 8). As shown therein, second serial/parallel resonance frequencies and third serial/parallel resonance frequencies are shifted to lower frequency ranges ($f_{s2} > f'_{s2}$), ($f_{p2} > f'_{p2}$), ($f_{s3} > f'_{s3}$), ($f_{p3} > f'_{p3}$), respectively, and fifth serial/parallel resonance frequencies are shifted to a higher frequency range ($f_{s5} < f'_{s5}$), ($f_{p5} < f'_{p5}$).

In the fifth division pattern $A_5$, the third serial resonance frequency $f'_{s3}$ is shifted to 57 MHz or less, and the third parallel resonance frequency $f'_{p3}$ is about 60 MHz. Accordingly, when the frequency of the first high frequency power HF is, for example, 60 MHz, even if the fifth division pattern $A_5$ is selected, the noise of the first high frequency power HF can also be securely blocked.

Furthermore, as depicted in FIG. 9B to FIG. 13B, in all of the division patterns $A_1$ to $A_5$, the first serial resonance frequency $f'_{s1}$ and the first parallel resonance frequency $f'_{p1}$ are mostly not shifted, and a relationship of $f'_{s1} \approx f_{s1}$ and $f'_{p1} \approx f_{p1}$ are maintained. Particularly, the first parallel resonance frequency $f'_{p1}$ is maintained at a value about 13 MHz. Whichever division pattern A is selected to obtain an optimum frequency-impedance characteristic for the frequency of the first high frequency power HF for plasma generation, constant high impedance can be obtained for the frequency (typically, 13 MHz or less) of the second high frequency power LF for ion attraction. Therefore, a filter design in which multiple parallel resonances are matched with the frequencies of both high frequency powers HF and LF at the same time can be simplified.

Moreover, in this exemplary embodiment, the comb-teeth members 114 or 128 extended in parallel to the coil axis direction are provided in the vicinity of or within the solenoid coils 104(1) and 104(2) in order to divide the solenoid coils 104(1) and 104(2) to the multiple sections $K_1$, $K_2$, . . . with the winding pitch p. Further, comb teeth $M_i$ which are formed at the inner surfaces or the outer surfaces of the comb-teeth members 114 or 128 and have a pitch $m_i$ corresponding to the winding pitch $p_i$ in each section $K_i$ are inserted into winding gaps of the solenoid coils 104(1) and 104(2).

With this configuration, since the winding pitch $p_i$ of the solenoid coils 104(1) and 104(2) is accurately set to a preset value by the comb-teeth pitch $m_i$ in each section $K_i$, the frequency-impedance characteristic or filter characteristic having high reproducibility and no object difference can be obtained. Furthermore, since the air gaps G are formed in winding gaps of the solenoid coils 104(1) and 104(2) except where the comb teeth M are inserted, heat generated from the coil is rapidly discharged out through the air gaps G. Therefore, the solenoid coils 104(1) and 104(2) can be cooled efficiently.

In addition, since the filter unit 54(IN) does not have the ring member between the solenoid coils 104(1) and 104(2) and the outer conductor 110, a high frequency noise introduced into the filter unit 54(IN) does not flow to the ground since the high frequency noise is bypassed to the outside in a radial direction, i.e., to the outer conductor 110 on the way down to the solenoid coils 104(1) and 104(2). Accordingly, an impedance function or a withstand voltage characteristic against the high frequency noise is not deteriorated.

Furthermore, in the present exemplary embodiment, in order to shift a part of the resonance frequencies among the multiple parallel resonance characteristics of the filters 102(1) and 102(2) selectively as stated above, a ratio between the lengths of the multiple section $K_1$, $K_2$, . . . set on the solenoid coils 104(1) and 104(2) and a ratio between the winding pitches $p_1$, $p_2$, . . . need to be selected to appropriate values. By way of example, as for the first division pattern $A_1$, if the first section $K_1$ is extremely short, e.g., S/100 or less, it may be difficult to achieve the effect of shifting a part of the resonance frequencies as shown in FIG. 9B. Likewise, when the winding pitch $p_1$ in the first section $K_1$ is different only several % from the winding pitch $p_2$ in the second section $K_2$, such a shifting effect for a part of the resonance frequencies may not be achieved, either.

According to the electromagnetic field computation conducted by the present inventor, it is desirable that the length of the first section $K_1$ is equal to or larger than ⅕ of the length of the second section $K_2$, and equal to or smaller than 5 times the length of the second section $K_2$. Further, it is also desirable that the winding pitch $p_1$ of the first section $K_1$ is equal to or larger than twice the winding pitch $p_2$ of the second section $K_2$, or equal to or less than ½ of the winding pitch $p_2$ of the second section $K_2$.

Physical Configuration within Filter Unit (Second Exemplary Embodiment)

Figure 14:
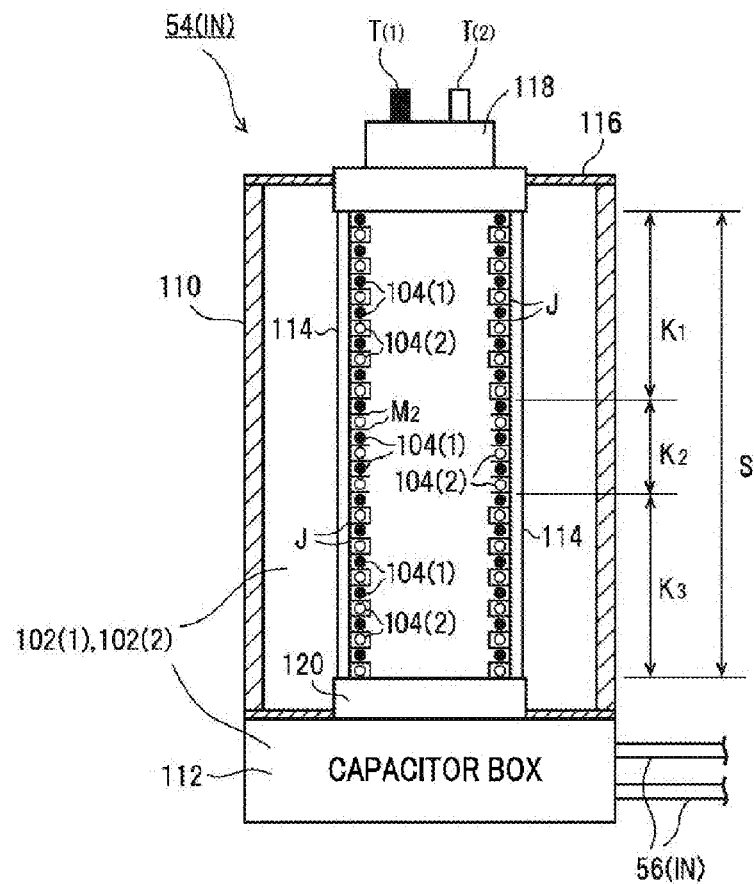
FIG. 14 is a longitudinal cross sectional view illustrating a structure of a filter unit according to a second exemplary embodiment.

FIG. 14 illustrates a physical structure within the filter unit 54(IN) according to a second exemplary embodiment. In this second exemplary embodiment, the solenoid coils 104(1) and 104(2) are divided to multiple sections $K_1$, $K_2$, . . . in the coil axis direction. Further, in one of the multiple sections, for example, in the section $K_2$, comb teeth $M_2$ of the comb-teeth member 114 (128) are inserted into winding gaps of the coils locally in the circumferential direction, as in the first exemplary embodiment. In other sections, for example, in the sections $K_1$ and $K_3$, the winding gaps are blocked by coil tube J in the entire circumferential direction. Except this, the other configurations in the second exemplary embodiment are mostly the same as those described in the first exemplary embodiment.

Figure 15:
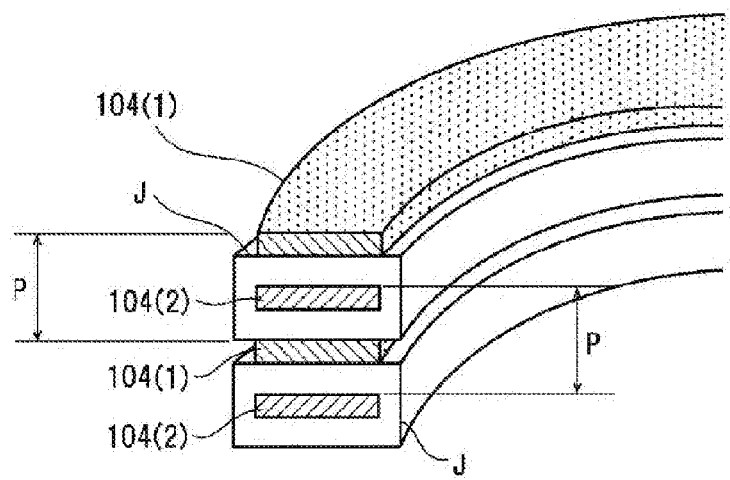
FIG. 15 is a partially enlarged perspective view illustrating a configuration of major parts of the filter unit according to the second exemplary embodiment.

In this case, in each of the sections $K_1$ and $K_3$ where the coil tube J is used, typically, a coil conductor of only one solenoid coil 104(2) is put through the coil tube J, as shown in FIG. 15. Without putting a coil conductor of the other solenoid coil 104(1) through the coil tube J, a constant winding pitch p and electrical insulation between the coils 104(1) and 104(2) can be obtained. However, it may be also possible to adopt a configuration in which coil conductors of both coils 104(1) and 104(2) are put through the respective coil tube J.

Operation of Filter Unit (Second Exemplary Embodiment)

In this second exemplary embodiment, as in the first exemplary embodiment, instead of providing the ring member between the solenoid coils 104(1) and 104(2) and the outer conductor 110 within the filter unit 54(IN), a physical characteristic of the solenoid coils 104(1) and 104(2), which determines C and/or L of the coaxial line, is set or adjusted independently for each of the multiple sections $K_1$, $K_2$, . . . . Thus, a characteristic impedance $Z_o=\sqrt{(LC)}$ is changed in each section without changing the gap of the coaxial line, so that a part or all of resonance frequencies of multiple parallel resonance are shifted.

More specifically, in the inter-winding structure, the solenoid coils 104(1) and 104(2) are divided to the multiple sections $K_1$, $K_2$, . . . as stated above, and in one of the sections, the comb teeth M are inserted into the winding gaps, whereas in the other sections, the winding gaps are blocked by the coil tube J. Accordingly, C and L of the coaxial line are changed in each section, and, thus, the characteristic impedance $Z_o=\sqrt{(LC)}$ is changed in each section, so that a part or all of the resonance frequencies of the multiple parallel resonance can be shifted. For example, in a division pattern of FIG. 14, in the section $K_2$ where the comb teeth M are inserted into the winding gaps, as the winding pitch $p_2$ decreases, C and L per a unit length are increased, so that the characteristic impedance $(Z_o=\sqrt{(LC)})$ is also increased. On the contrary, as the winding pitch $p_2$ increases, C and L per a unit length are decreased, so that the characteristic impedance $Z_o=\sqrt{(LC)}$ is also decreased. Furthermore, in the sections $K_1$ and $K_3$ where the winding gaps are blocked by the coil tube J, if the winding pitch therein is constant, C per a unit length increases as a dielectric constant $\in$ of the coil tube J increases, so that the characteristic impedance $Z_o=\sqrt{(LC)}$ is also increased. On the contrary, as the dielectric constant $\in$ of the coil tube J decreases, C per a unit length is also decreased, so that the characteristic impedance $Z_o=\sqrt{(LC)}$ is decreased.

Figure 16:
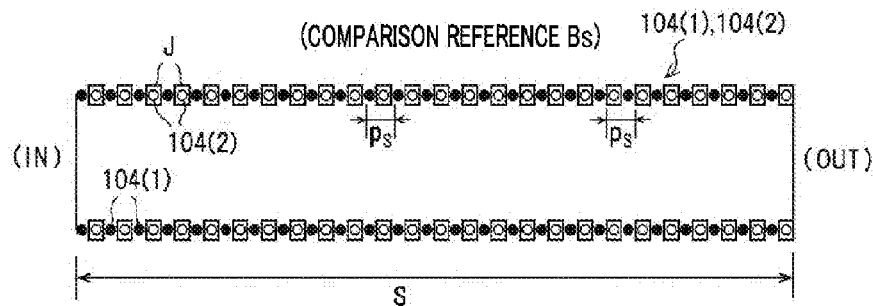
FIG. 16 is a diagram showing a comparison reference regarding a winding pitch of a solenoid coil in the second exemplary embodiment.

To verify effects of the above-described technique according to the second exemplary embodiment, the present inventor has acquired, by the electromagnetic field computation, the frequency-impedance characteristics of the first filter 102(1) including the solenoid coil 104(1) in each of five division patterns $B_1$ to $B_5$ where a winding pitch of the solenoid coils 104(1) and 104(2) is set to be uniform (constant value $p_s$) from one end to the other end of each coil, and where the comb teeth M are inserted into the winding gaps in only a single section having a length of S/5 and the winding gaps in all of the other sections are blocked by the coil tube J. Then, the frequency-impedance characteristic acquired for each division pattern $B_n$ (n=1~5) is compared with a frequency-impedance characteristic obtained by the electromagnetic field computation for a configuration (comparison reference $B_s$) where a solenoid coil is not divided to multiple sections, and where a winding pitch is set to be uniform (constant value $p_s$) and the winding gaps from one end to the other end of the coil are blocked by the coil tube J, as shown in FIG. 16. In this case as well, since the second filter 102(2) including the solenoid coil 104(2) has the same configuration as that of the first filter 102(1), the frequency-impedance characteristics of the second filter 102(2) have substantially the same as those of the first filter 102(1). Further, in the aforementioned electromagnetic field computation, the dielectric constant of the coil tube J is set to have a value of 4. By way of example, if the coil tube J is made of PEEK, the dielectric constant of 4 can be obtained.

Figure 17A:
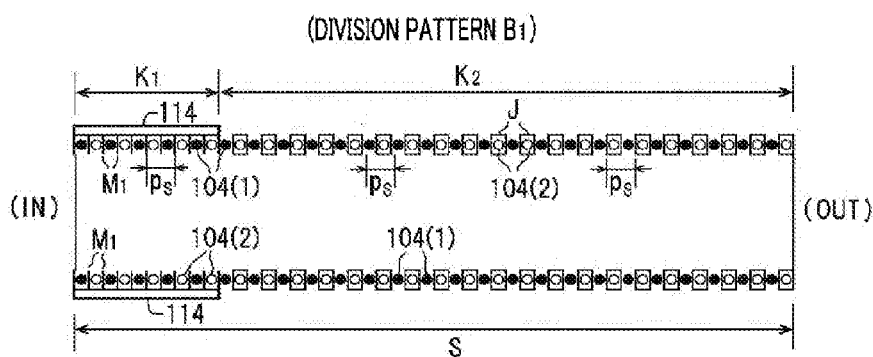
FIG. 17A is a diagram showing a first division pattern regarding a winding pitch of a solenoid coil in the second exemplary embodiment.
Figure 17B:
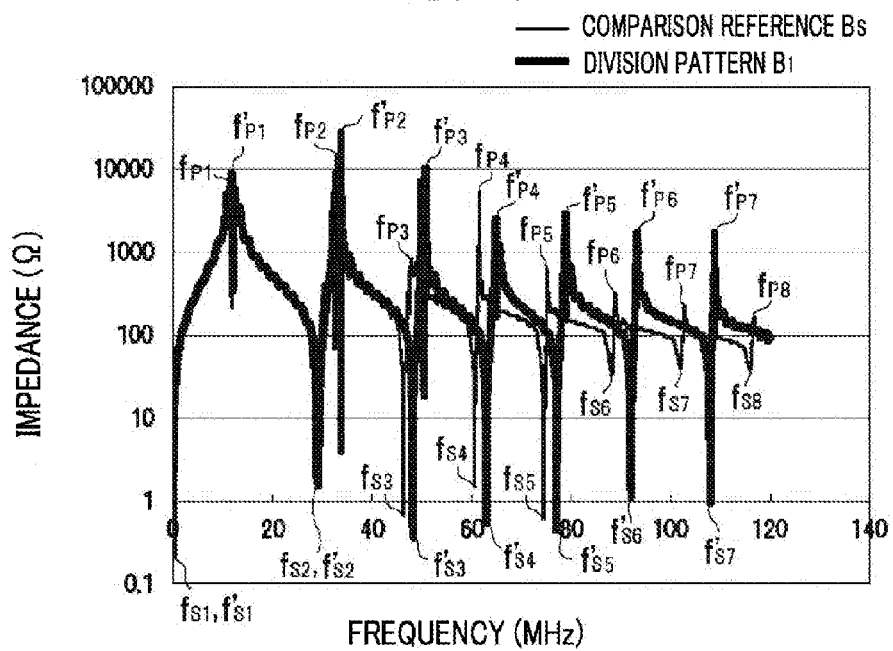
FIG. 17B is a diagram showing a frequency-impedance characteristic of the first division pattern in comparison with a frequency-impedance characteristic of the comparison reference (FIG. 16).

In a first division pattern $B_1$, as shown in FIG. 17A, the solenoid coils 104(1) and 104(2) are divided to two sections $K_1$ and $K_2$ at a length ratio of 1:4 from the inlet (IN) toward the outlet (OUT). The comb teeth $M_1$ are inserted into the winding gaps within the first section $K_1$, and winding gaps in the second section $K_2$ are blocked by the coil tube J.

Figure 18A:
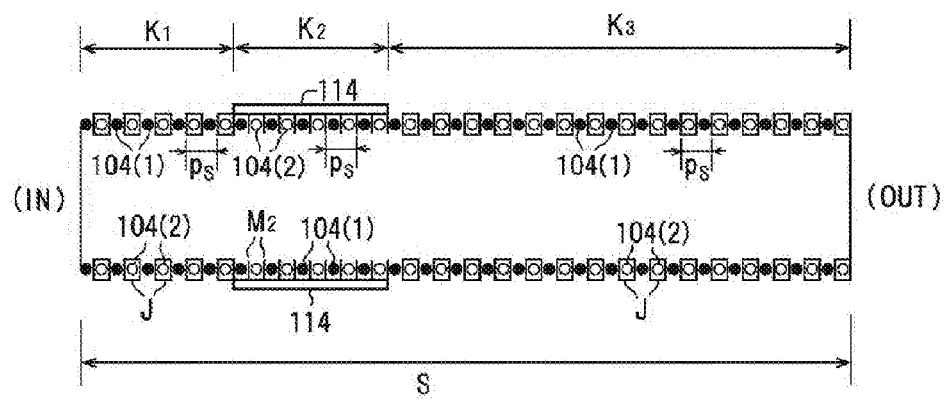
FIG. 18A is a diagram showing a second division pattern in the second exemplary embodiment.
Figure 18B:
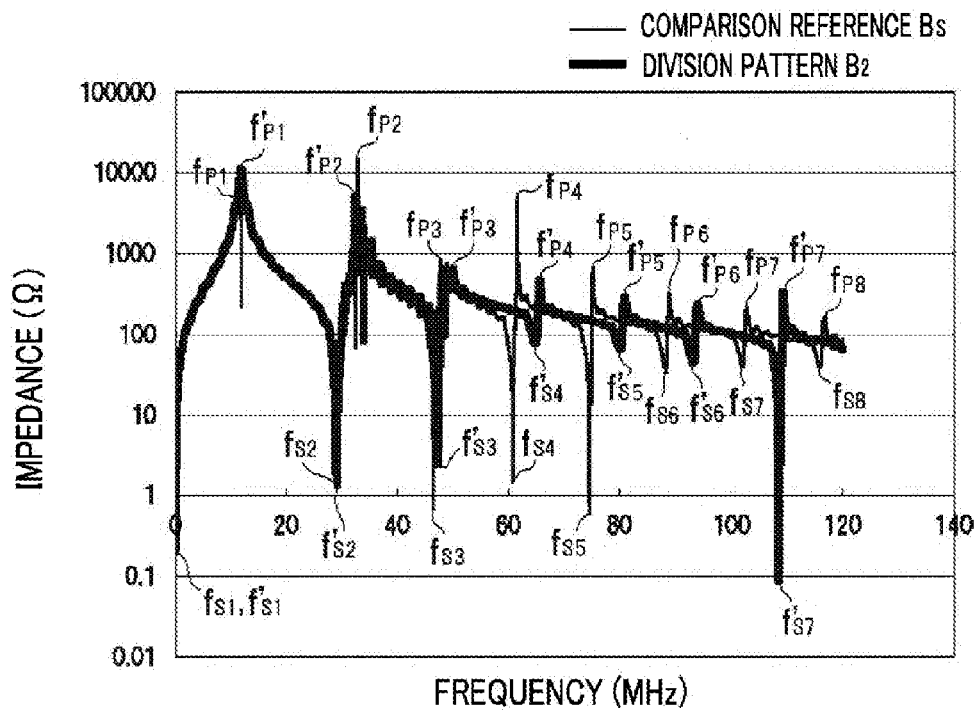
FIG. 18B is a diagram showing a frequency-impedance characteristic of the second division pattern in comparison with the frequency-impedance characteristic of the comparison reference (FIG. 16).

In a second division pattern $B_2$, as shown in FIG. 18A, the solenoid coils 104(1) and 104(2) are divided to three sections $K_1$, $K_2$ and $K_3$ at a length ratio of 1:1:3 from the inlet (IN) toward the outlet (OUT). The comb teeth $M_2$ are inserted into the winding gaps within the second section $K_2$, and the winding gaps in the first and third sections $K_1$ and $K_3$ are blocked by the coil tube J.

Figure 19A:
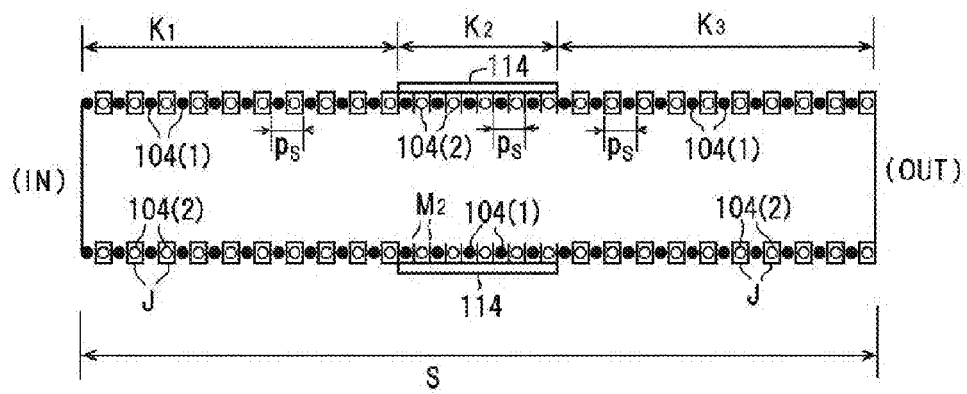
FIG. 19A is a diagram showing a third division pattern in the second exemplary embodiment.
Figure 19B:
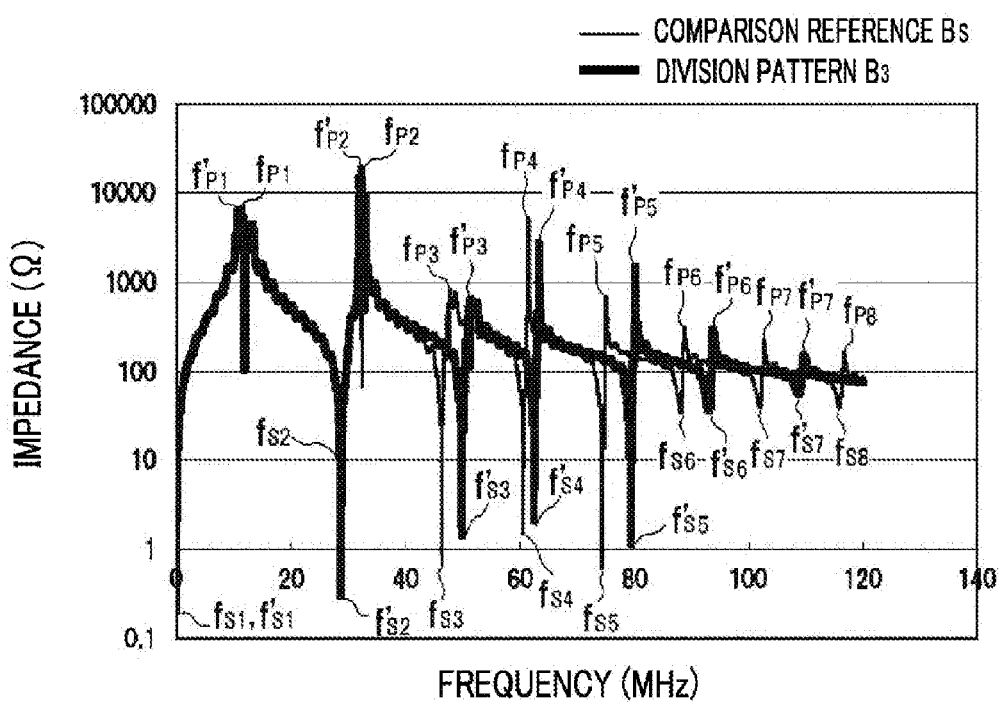
FIG. 19B is a diagram showing a frequency-impedance characteristic of the third division pattern in comparison with the frequency-impedance characteristic of the comparison reference (FIG. 16).

In a third division pattern $B_3$, as shown in FIG. 19A, the solenoid coils 104(1) and 104(2) are divided to three sections $K_1$, $K_2$ and $K_3$ at a length ratio of 2:1:2 from the inlet (IN) toward the outlet (OUT). The comb teeth $M_2$ are inserted into the winding gaps within the second section $K_2$, and the winding gaps in the first and third sections $K_1$ and $K_3$ are blocked by the coil tube J.

Figure 20A:
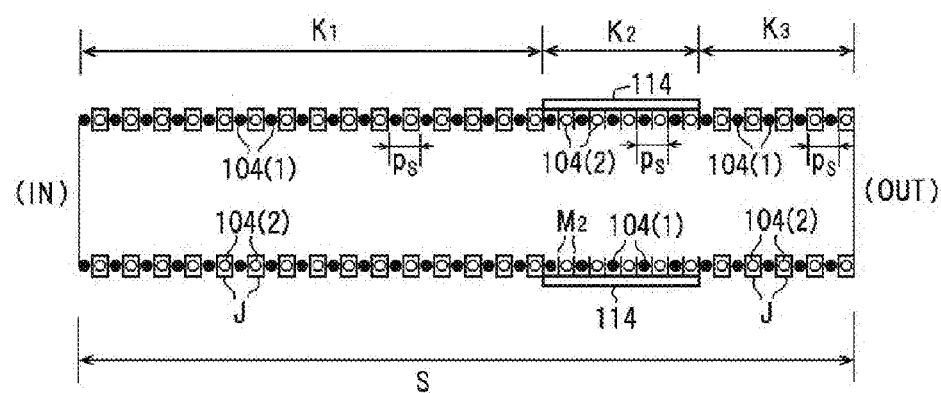
FIG. 20A is a diagram showing a fourth division pattern in the second exemplary embodiment.
Figure 20B:
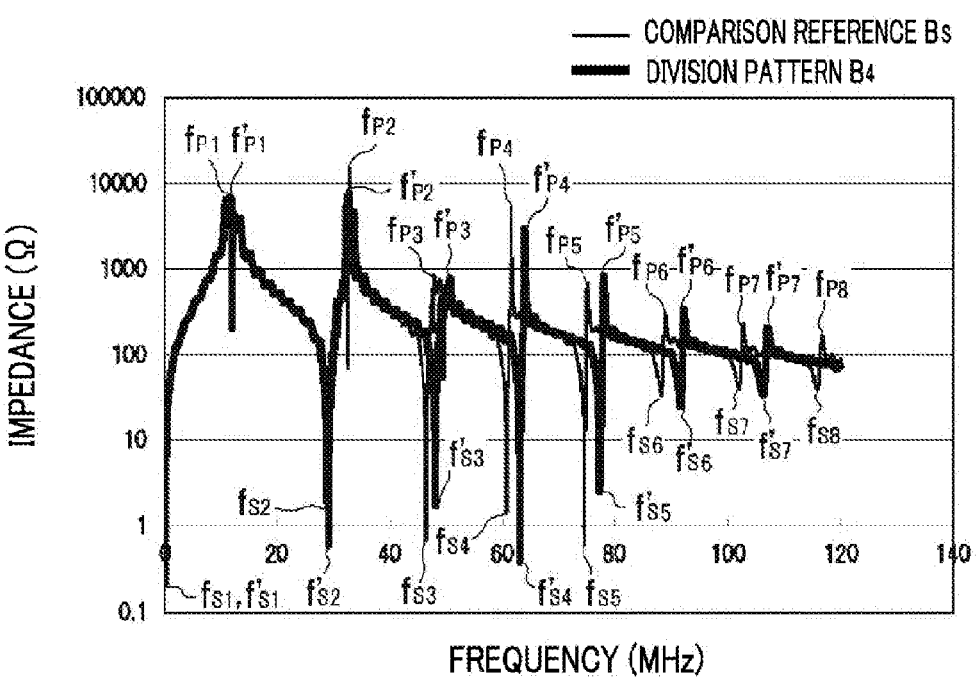
FIG. 20B is a diagram showing a frequency-impedance characteristic of the fourth division pattern in comparison with the frequency-impedance characteristic of the comparison reference (FIG. 16).

In a fourth division pattern $B_4$, as shown in FIG. 20A, the solenoid coils 104(1) and 104(2) are divided to three sections $K_1$, $K_2$ and $K_3$ at a length ratio of 3:1:1 from the inlet (IN) toward the outlet (OUT). The comb teeth $M_2$ are inserted into the winding gaps within the second section $K_2$, and the winding gaps in the first and third sections $K_1$ and $K_3$ are blocked by the coil tube J.

Figure 21A:
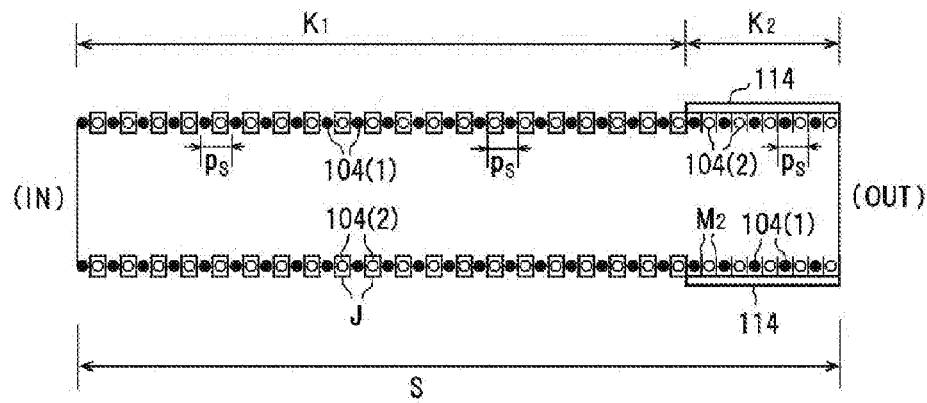
FIG. 21A is a diagram showing a fifth division pattern in the second exemplary embodiment.
Figure 21B:
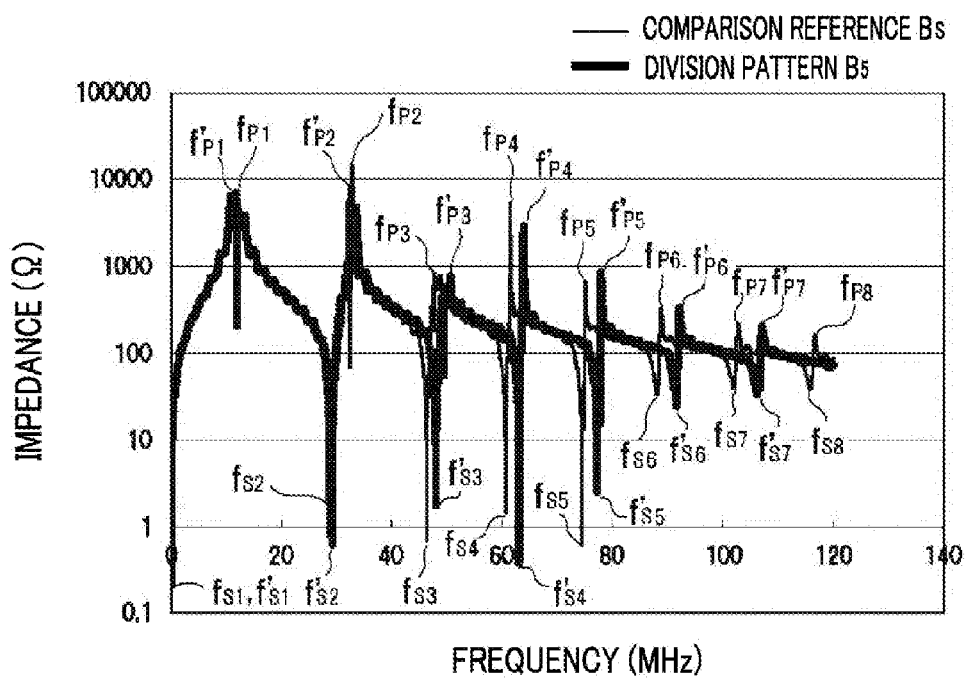
FIG. 21B is a diagram showing a frequency-impedance characteristic of the fifth division pattern in comparison with the frequency-impedance characteristic of the comparison reference (FIG. 16).

In a fifth division pattern $B_5$, as illustrated in FIG. 21A, the solenoid coils 104(1) and 104(2) are divided to two sections $K_1$ and $K_2$ at a length ratio of 4:1 from the inlet (IN) toward the outlet (OUT). The winding gaps in the first section $K_1$ are blocked by the coil tube J, and the comb teeth $M_2$ are inserted into the winding gaps within the second section $K_2$.

FIG. 17B to FIG. 21B depict the frequency-impedance characteristics in the first to fifth division patterns $B_1$ to $B_5$ (FIG. 17A to FIG. 21A) in comparison with the frequency-impedance characteristic in the comparison reference $B_s$ (FIG. 16). As shown therein, in all of the division patterns $B_1$ to $B_5$, all of the serial resonance frequencies and the parallel resonance frequencies after the third ones are shifted to higher frequency ranges ($f_{s3} < f'_{s3}$), ($f_{p3} < f'_{p3}$)~($f_{s6} < f'_{s6}$), ($f_{p6} < f'_{p6}$), respectively.

Figure 22:
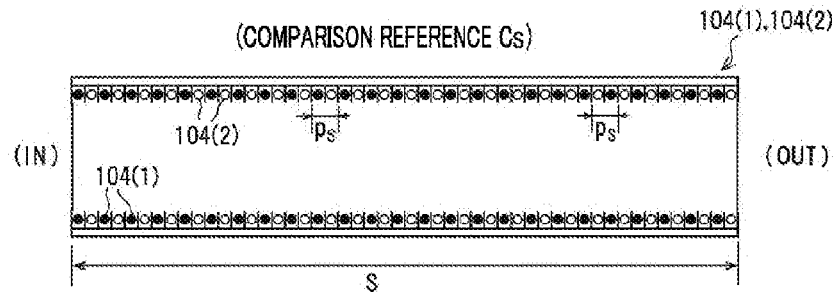
FIG. 22 is a diagram showing a comparison reference regarding a winding pitch of a solenoid coil in a modification example of the second exemplary embodiment.

In addition, the present inventor has also conducted a reverse-mode simulation for the second exemplary embodiment, and have acquired, by the electromagnetic field computation, the frequency-impedance characteristics for each of five division patterns $C_1$ to $C_5$ where a winding pitch of the solenoid coils 104(1) and 104(2) is set to be uniform (constant value $p_s$) from one end to the other end of each coil, where the winding gaps in only one section having a length of S/5 are blocked by the coil tube J and the comb teeth M are inserted into winding gaps in all of the other sections. Then, the frequency-impedance characteristic acquired for each division pattern $C_n$ (n=1~5) is compared with a frequency-impedance characteristic obtained by the electromagnetic field computation for a configuration (comparison reference $C_s$) where a solenoid coil is not divided to multiple sections, a winding pitch is set to be uniform (constant value $p_s$), and the comb teeth M are inserted into the winding gaps from one end to the other end of each coil, as shown in FIG. 22. In this case as well, the dielectric constant of the coil tube J is set to have a value of 4.

Figure 23A:
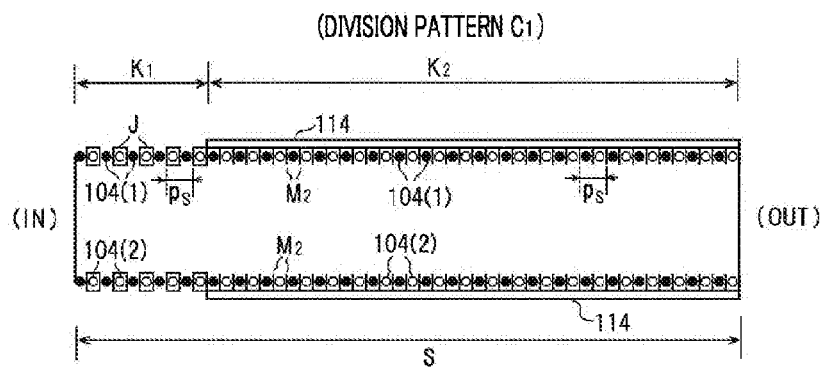
FIG. 23A is a diagram showing a first division pattern regarding a winding pitch of a solenoid coil in the modification example.
Figure 23B:
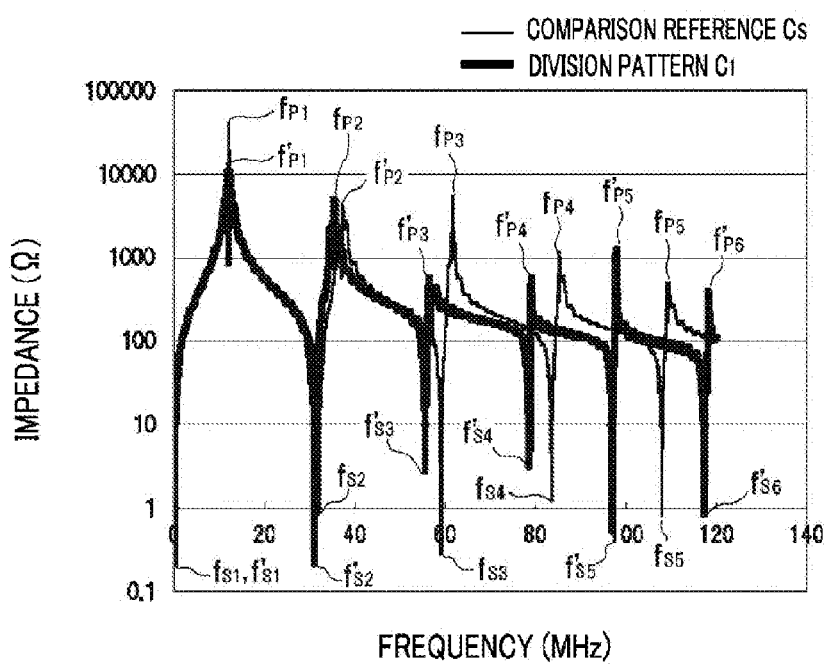
FIG. 23B is a diagram showing a frequency-impedance characteristic of the first division pattern in comparison with a frequency-impedance characteristic of the comparison reference (FIG. 22).

In a first division pattern $C_1$, as illustrated in FIG. 23A, the solenoid coils 104(1) and 104(2) are divided to two sections $K_1$ and $K_2$ at a length ratio of 1:4 from the inlet (IN) toward the outlet (OUT). The winding gaps in the first section $K_1$ are blocked by the coil tube J, and the comb teeth $M_2$ are inserted into the winding gaps within the second section $K_2$.

Figure 24A:
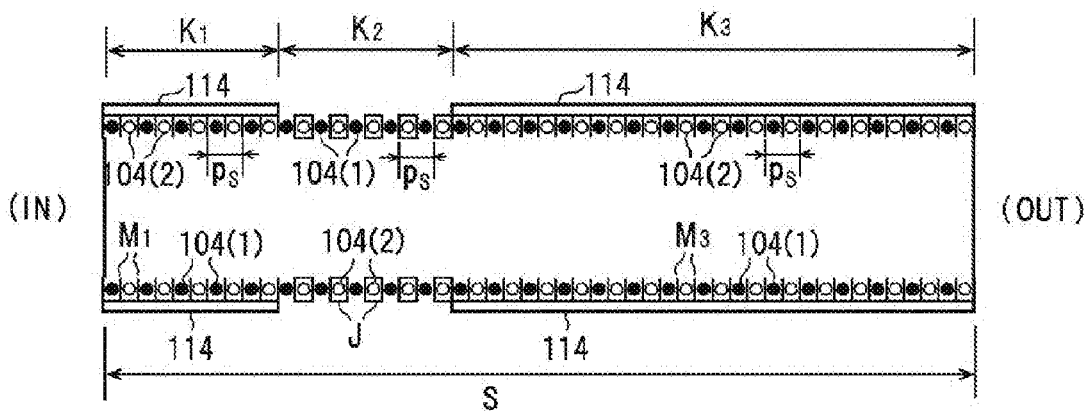
FIG. 24A is a diagram showing a second division pattern in the modification example.
Figure 24B:
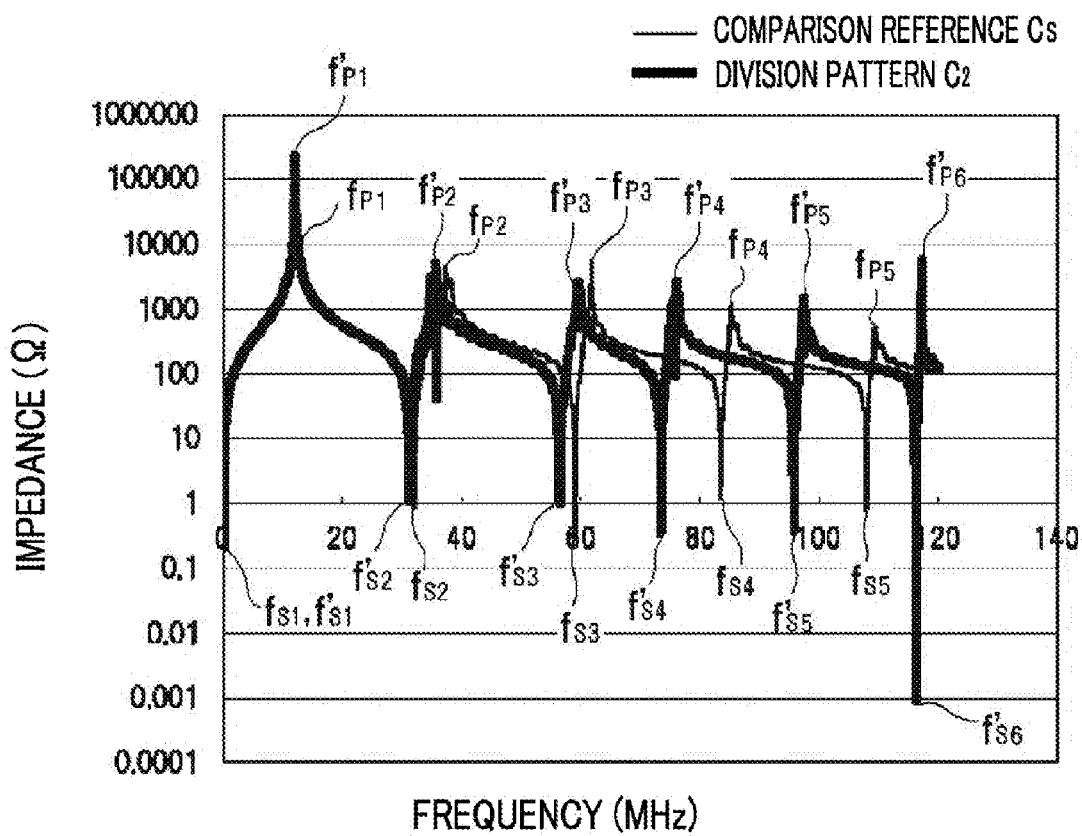
FIG. 24B is a diagram showing a frequency-impedance characteristic of the second division pattern in comparison with the frequency-impedance characteristic of the comparison reference (FIG. 22).

In a second division pattern $C_2$, as shown in FIG. 24A, the solenoid coils 104(1) and 104(2) are divided to three sections $K_1$, $K_2$ and $K_3$ at a length ratio of 1:1:3 from the inlet (IN) toward the outlet (OUT). The winding gaps in the second section $K_2$ are blocked by the coil tube J, and the comb teeth $M_1$ and $M_3$ are inserted into the winding gaps within the first and third sections $K_1$ and $K_3$, respectively.

Figure 25A:
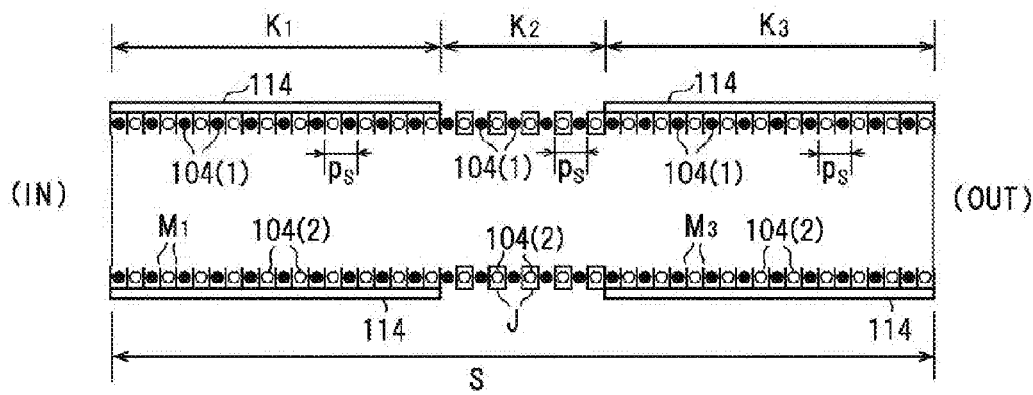
FIG. 25A is a diagram showing a third division pattern in the modification example.
Figure 25B:
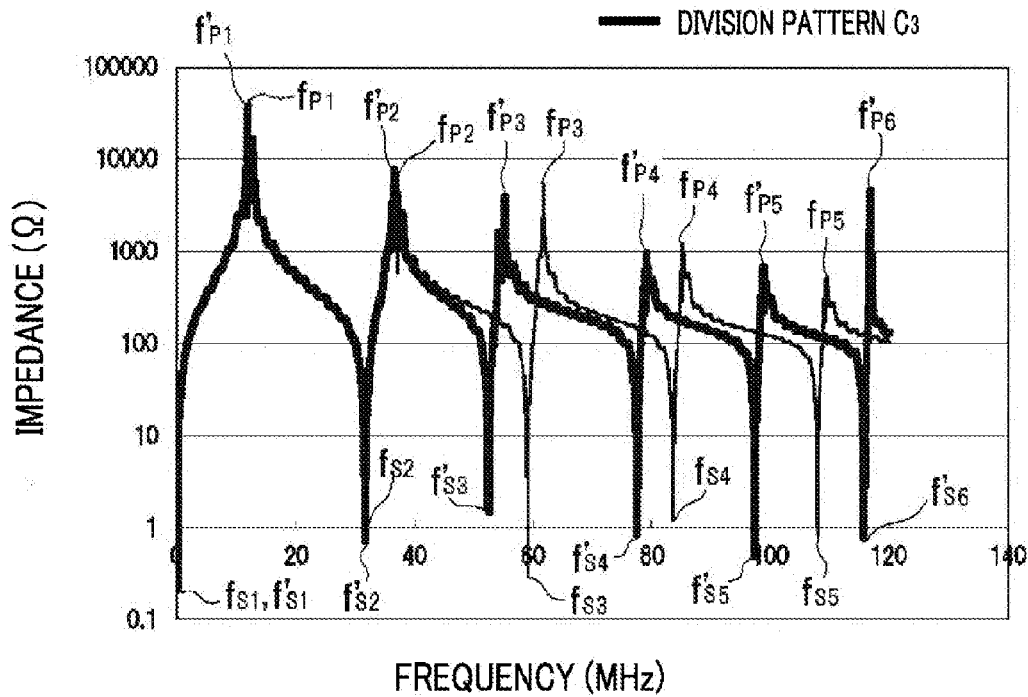
FIG. 25B is a diagram showing a frequency-impedance characteristic of the third division pattern in comparison with the frequency-impedance characteristic of the comparison reference (FIG. 22).

In a third division pattern $C_3$, as shown in FIG. 25A, the solenoid coils 104(1) and 104(2) are divided to three sections $K_1$, $K_2$ and $K_3$ at a length ratio of 2:1:2 from the inlet (IN) toward the outlet (OUT). The winding gaps in the second section $K_2$ are blocked by the coil tube J, and the comb teeth $M_1$ and $M_3$ are inserted into the winding gaps within the first and third sections $K_1$ and $K_3$, respectively.

Figure 26A:
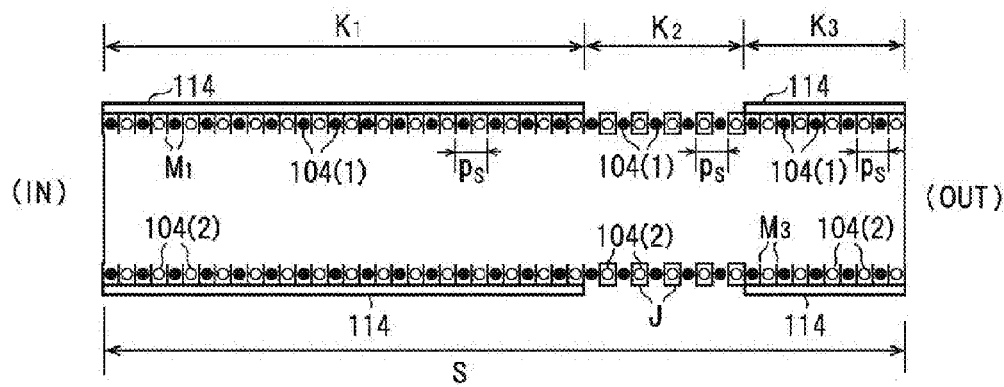
FIG. 26A is a diagram showing a fourth division pattern in the modification example.
Figure 26B:
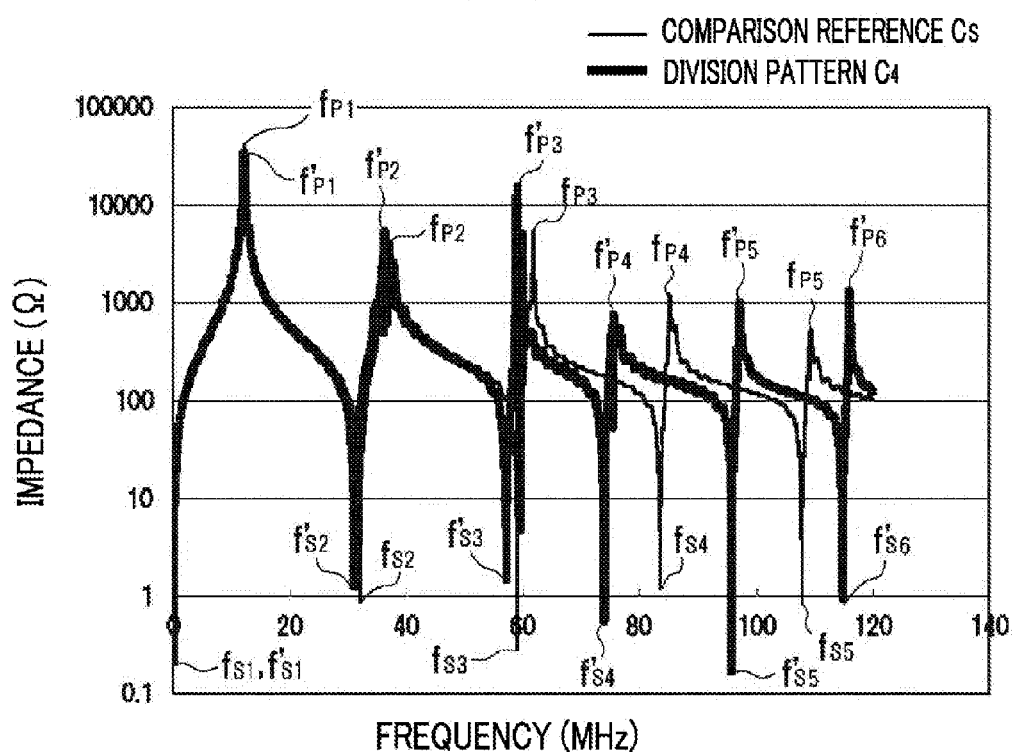
FIG. 26B is a diagram showing a frequency-impedance characteristic of the fourth division pattern in comparison with the frequency-impedance characteristic of the comparison reference (FIG. 22).

In a fourth division pattern $C_4$, as shown in FIG. 26A, the solenoid coils 104(1) and 104(2) are divided to three sections $K_1$, $K_2$ and $K_3$ at a length ratio of 3:1:1 from the inlet (IN) toward the outlet (OUT). The winding gaps in the second section $K_2$ are blocked by the coil tube J, and the comb teeth $M_1$ and $M_3$ are inserted into the winding gaps within the first and third sections $K_1$ and $K_3$, respectively.

Figure 27A:
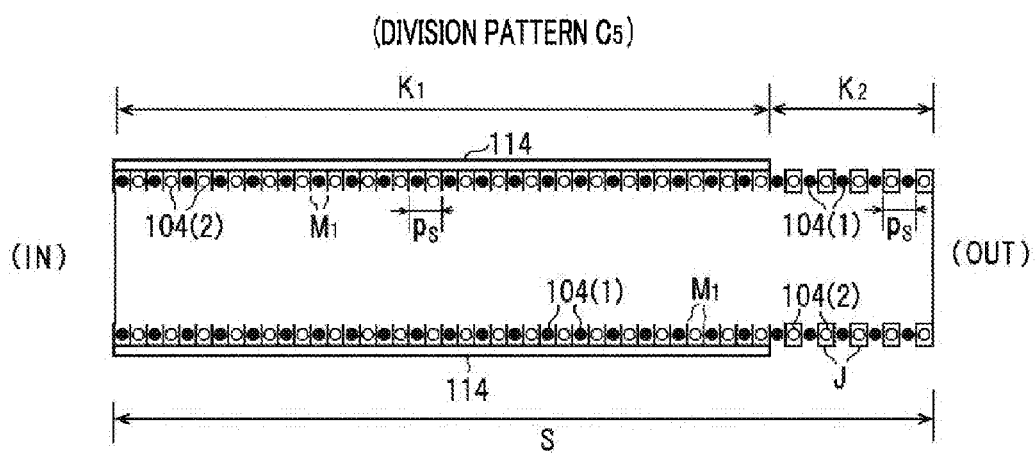
FIG. 27A is a diagram showing a fifth division pattern in the modification example.
Figure 27B:
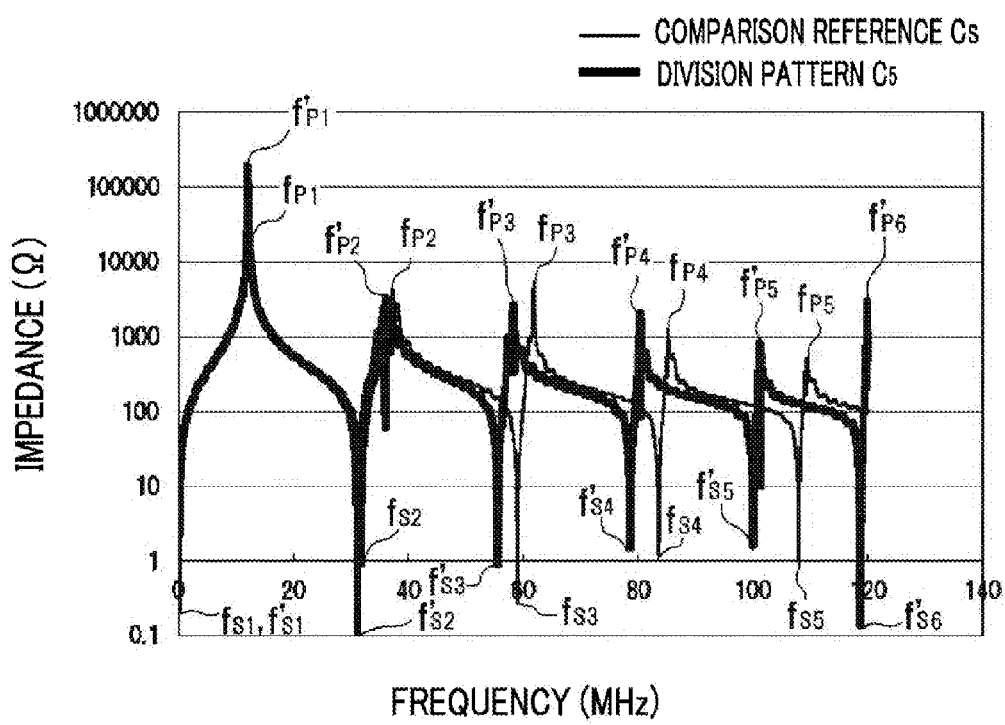
FIG. 27B is a diagram showing a frequency-impedance characteristic of the fifth division pattern in comparison with the frequency-impedance characteristic of the comparison reference (FIG. 22).

In a fifth division pattern $C_5$, as illustrated in FIG. 27A, the solenoid coils 104(1) and 104(2) are divided to two sections $K_1$ and $K_2$ at a length ratio of 4:1 from the inlet (IN) toward the outlet (OUT). The comb teeth $M_1$ are inserted into the winding gaps in the first section $K_1$, and the winding gaps within the second section $K_2$ are blocked by the coil tube J.

FIG. 23B to FIG. 27B depict the frequency-impedance characteristics in the first to fifth division patterns $C_1$ to $C_5$ (FIG. 23A to FIG. 27A) in comparison with the frequency-impedance characteristic in the comparison reference $C_s$ (FIG. 22). As shown therein, in all of the division patterns $C_1$ to $C_5$, all of the serial resonance frequencies and the parallel resonance frequencies after the third ones are shifted to lower frequency ranges ($f_{s3} > f'_{s3}$), ($f_{p3} > f'_{p3}$)~($f_{s6} > f'_{s6}$), ($f_{p6} > f'_{p6}$), respectively.

As stated above, in this second exemplary embodiment, if the above-described first to fifth division patterns $B_1$ to $B_5$ are selected, the resonance frequencies after the third ones of the multiple parallel resonance obtained in the comparison reference $B_s$ can be shifted to higher frequency ranges. If the first to fifth division patterns $C_1$ to $C_5$ of the reverse modes are selected, on the other hand, the resonance frequencies after the third ones of the multiple parallel resonance obtained in the comparison reference $B_s$ can be shifted to lower frequency ranges.

In the second exemplary embodiment as well, the first serial resonance frequency $f_{s1}$ and the first parallel resonance frequency $f_{p1}$ are mostly not shifted, and a relationship of $f'_{s1} \approx f_{s1}$ and $f'_{p1} \approx f_{p1}$ is maintained. Particularly, the first parallel resonance frequency $f_{p1}$ is maintained about 13 MHz. Whichever division pattern B is selected to obtain an optimum frequency-impedance characteristic for the frequency of the first high frequency power HF for plasma generation, constant high impedance can be obtained for the frequency (typically, 13 MHz or less) of the second high frequency power LF for ion attraction. Therefore, a filter design in which multiple parallel resonances are matched with the frequencies of both high frequency powers HF and LF at the same time can be simplified.

Further, in the second exemplary embodiment, in the section $K_i$ where the winding gaps of the solenoid coils 104(1) and 104(2) are not blocked by the coil tube J, the comb teeth $M_i$ having the pitch $m_i$ corresponding to the winding pitch $p_i$ are inserted into the winding gaps of the solenoid coils 104(1) and 104(2). Thus, it is possible to obtain the frequency-resonance characteristic or filter characteristic having little object difference, as compared to a case where the comb teeth $M_i$ are not inserted in this section $K_i$.

In addition, in the second exemplary embodiment as well, the ring member is not provided between the solenoid coils 104(1) and 104(2) and the outer conductor 110. Thus, an impedance function or a withstand voltage characteristic against the high frequency noise is not deteriorated.

In this second exemplary embodiment, in order to shift a part of the resonance frequencies of the multiple parallel resonance characteristics of the filters 102(1) and 102(2) selectively, the dielectric constant of the coil tube J needs to be set to be remarkably or much higher than a value of 1 (dielectric constant of the air gaps G). According to t the electromagnetic field computation conducted by the present inventor, in the division patterns where, as in the second exemplary embodiment, the winding pitch in all sections is set to be uniform (constant value $p_s$), and where the comb teeth M are inserted into the winding gaps in only one section and the winding gaps in all of the other sections are blocked by the coil tube J, it is desirable to set the dielectric constant of the coil tube J to have a value of 2 or more.

Other Exemplary Embodiments or Modification Examples

While the disclosure has been described with respect to the exemplary embodiments, the exemplary embodiments are not limiting, and various changes and modifications may be made without departing from the scope of the technical conceptions of the present disclosure.

By way of example, in the first exemplary embodiment where the solenoid coils 104(1) and 104(2) within the filter unit 54(IN) are divided to the multiple sections, division patterns of the reverse modes to the first to fifth division patterns $A_1$ to $A_5$, i.e., division patterns in which a winding pitch p of one section is set to be much larger than a winding pitch p of the other sections may be employed.

By way of non-limiting example, in the reverse mode of the second division pattern $A_2$, the solenoid coils 104(1) and 104(2) are divided to three sections $K_1$, $K_2$ and $K_3$ having a length ratio of 1:1:3 from the inlet (IN) toward the outlet (OUT), and the winding pitches $p_1$, $p_2$ and $p_3$ in these three sections $K_1$, $K_2$ and $K_3$ are set to have a ratio of 1:2:1. Here, $p_1$, $p_2$ and $p_3$ are set to be $p_1=0.56p_s$, $p_2=1.12p_s$, and $p_3=0.56p_s$. In the frequency-impedance characteristic of this reverse mode, second serial/parallel resonance frequencies and fourth serial/parallel resonance frequencies are shifted to higher frequency ranges ($f_{s2}<f'_{s2}$), ($f_{p2}<f'_{p2}$)/($f_{s4}<f'_{s4}$), ($f_{p4}<f'_{p4}$), respectively, and third serial/parallel resonance frequencies are shifted to a lower frequency range ($f_{s3}>f'_{s3}$), ($f_{p3}>f'_{p3}$).

In the first and second exemplary embodiments, the division patterns $A_1$ to $A_5$, $B_1$ to $B_5$ and $C_1$ to $C_5$ are nothing more than examples, and various modifications may be made regarding the number of the division sections, the winding pitches, and so forth.

Figure 28:
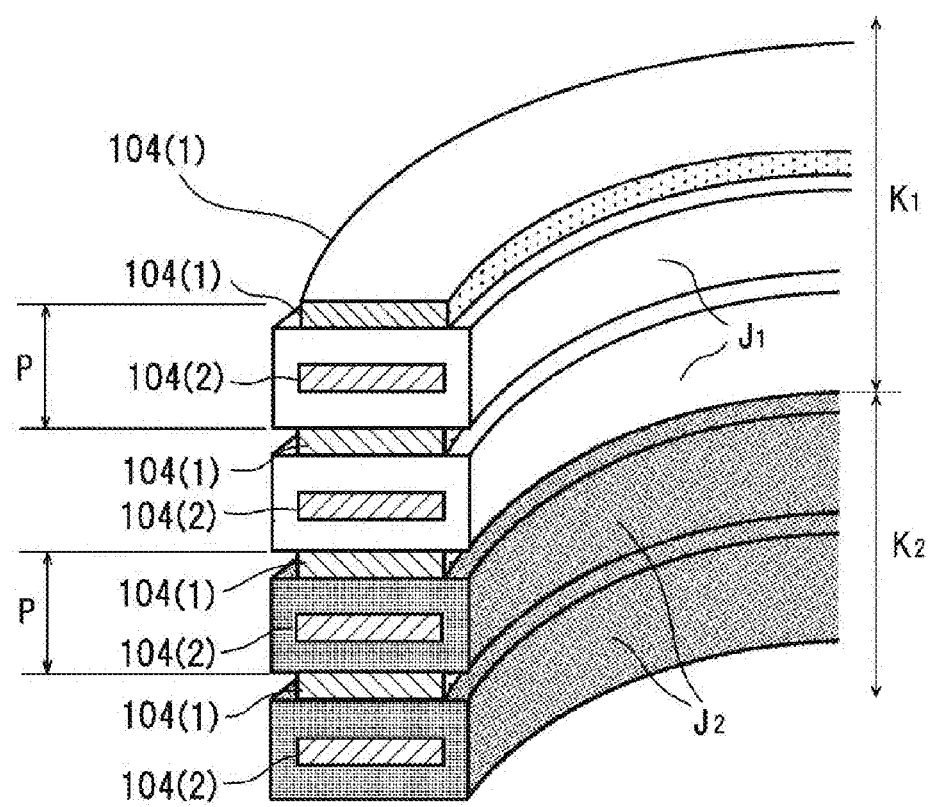
FIG. 28 is a partially enlarged perspective view illustrating an inter-winding structure of a coil according to a third exemplary embodiment.

In addition, as a third exemplary embodiment shown in FIG. 28, it may be possible to adopt a configuration in which the solenoid coils 104(1) and 104(2) are divided to multiple sections $K_1$, $K_2$, . . . in the inter-winding structure, and the winding gaps in some sections (e.g., the section $K_1$) are blocked in the entire circumferential direction by a first coil tube $J_1$ having a first dielectric constant, and the winding gaps in other sections (e.g., the section $K_2$) are blocked in the entire circumferential direction by a second coil tube $J_2$ having a second dielectric constant. As an example, the first coil tube $J_1$ may be made of Teflon (registered trademark) having a dielectric constant of 1, and the second coil tube $J_2$ may be made of PEEK having a dielectric constant of 4.

In the above-described exemplary embodiments, within the single outer conductor 110, the coil conductor forming the solenoid coil 104(1) of the first filter 102(1) and the coil conductor forming the solenoid coil 104(2) of the second filter 102(2) are spirally wound while being overlapped. In this coil winding structure, self-inductance between both solenoid coils 104(1) and 104(2) are same each other, and maximum mutual inductance can be obtained. As a result, a RF power loss in the filter unit 54(IN) is reduced, and an apparatus difference in the RF power loss is reduced. Further, though not illustrated, it is also possible to adopt a configuration in which the solenoid coil 104(1) of the first filter 102(1) and the solenoid coil 104(2) of the second filter 102(2) are accommodated in separate outer conductors 110, respectively. In such a case, when the aforementioned comb-teeth members 114 or 128 are provided, a winding pitch p and a comb-teeth pitch m are same, and a relationship of p=m is established.

The above-described exemplary embodiments are directed to a filter configured to, in a capacitively coupled plasma etching apparatus of a lower electrode dual frequency application type in which the first high frequency power HF for plasma generation and the second high frequency power LF for ion attraction are applied to the susceptor 12 within the chamber 10, reduce noises of both high frequency powers on a pair of the heater power feed lines 100(1) and 100(2) electrically connecting the heating element 40 mounted in the susceptor 12 and the heater power supplies 58(IN) and 58(OUT) provided outside the chamber 10. However, the filter or the filter unit of the above-described exemplary embodiments may be properly applied to a capacitively coupled plasma etching apparatus of an upper-and-lower electrode dual frequency application type configured to apply the first high frequency power HF for plasma generation to an upper electrode 64 while applying the second high frequency power LF for ion attraction to the susceptor 12, or a capacitively coupled plasma etching apparatus of a lower electrode single frequency application type configured to apply a single high frequency power to the susceptor 12.

Furthermore, the exemplary embodiments are not limited to the filter for a power cable such as the heater power feed line, but may also be applicable to any filter or filter unit provided on a pair of lines or a single line configured to electrically connect an electrical member within a chamber and an external circuit of a power meter or a signal meter provided outside the chamber.

The present exemplary embodiment may not be limited to the capacitively coupled plasma etching apparatus but can be applied to various types of plasma etching apparatuses such as a microwave plasma etching apparatus, an inductively coupled plasma etching apparatus, a helicon wave plasma etching apparatus, etc. and, also, can be applied to other plasma processing apparatuses such as a plasma CVD apparatus, a plasma oxidizing apparatus, a plasma nitriding apparatus, a sputtering apparatus, etc. Further, the processing target substrate may not be limited to the semiconductor wafer but may be a photomask, a CD substrate, a print substrate, or one of various types of substrates for a flat panel display, an organic EL and a solar cell.

EXPLANATION OF REFERENCE NUMERALS

10: Chamber
12: Susceptor (lower electrode)
28: High frequency power supply (for plasma generation)
30: High frequency power supply (for ion attraction)
40(IN): Inner heating wire
40(OUT): Outer heating wire
54(IN), 54(OUT): Filter unit
58(IN), 58(OUT): Heater power supply
100(1), 100(2): Power feed line
102(1), 102(2): Filter
104(1), 104(2): Solenoid coil
106(1), 106(2): Capacitor
110: outer conductor
114: Rod-shaped comb-teeth member
128: Plate-shaped comb-teeth member
M, $M_1$ to $M_3$: Comb teeth

I claim:

1. A plasma processing apparatus, including an external circuit of a power meter or a signal meter electrically connected via a line to an electrical member within a processing vessel in which a plasma process is performed, configured to reduce or block a high frequency noise of a predetermined frequency introduced from the electrical member into the line toward the external circuit by a filter provided on the line, wherein the filter comprises:

a single solenoid coil forming a part of the line; and a cylindrical outer conductor, accommodating or surrounding the solenoid coil, configured to form, by being combined with the solenoid coil, a distributed constant line in which parallel resonance occurs at multiple frequencies, wherein the solenoid coil has a first section and a second section having different winding pitches in an axis direction thereof, the winding pitch of the first section is equal to or larger than twice the winding pitch of the second section, or equal to or less than ½ the winding pitch of the second section, the filter has, in the first section, first comb teeth which are made of an insulating material and inserted in winding gaps of the solenoid coil locally at plural positions in a circumferential direction thereof, and the first comb teeth are formed on an inner surface of a rod-shaped member composed of a plurality of insulating members which are extended in parallel to the solenoid coil in the coil axis direction and, also, arranged adjacent to an outer peripheral surface of the solenoid coil.

2. The plasma processing apparatus of claim 1, wherein the filter has, in the second section, second comb teeth which are made of an insulating material and inserted in winding gaps of the solenoid coil locally at plural positions in a circumferential direction thereof.

3. The plasma processing apparatus of claim 1, wherein the filter has, in the second section, a second coil tube which is made of an insulating material and configured to block winding gaps of the solenoid coil entirely in a circumferential direction thereof.

4. The plasma processing apparatus of claim 1, wherein the solenoid coil has a third section arranged between the first section and the second section in the coil axis direction, and a winding pitch of the third section is the same as the winding pitch of the first section.

5. The plasma processing apparatus of claim 4, wherein the filter has, in the third section, third comb teeth made of an insulating material and inserted in winding gaps of the solenoid coil locally at plural positions in a circumferential direction thereof.

6. The plasma processing apparatus of claim 5, wherein the filter has, in the second section, a second coil tube which is made of an insulating material and configured to block winding gaps of the solenoid coil entirely in the circumferential direction thereof.

7. The plasma processing apparatus of claim 4, wherein the filter has, in the third section, third coil tube which is made of an insulating material and configured to block winding gaps of the solenoid coil entirely in a circumferential direction thereof.

8. The plasma processing apparatus of claim 7, wherein the filter has, in the second section, second comb teeth which are made of an insulating material and inserted in winding gaps of the solenoid coil locally at plural positions in the circumferential direction thereof.

9. The plasma processing apparatus of claim 1, wherein a length of the first section is equal to or larger than ⅕ of a length of the second section and equal to or smaller than 5 times the length of the second section in the coil axis direction.

10. The plasma processing apparatus of claim 1, wherein a shape and a size of a horizontal cross section of each of the solenoid coil and the outer conductor are uniform along the distributed constant line.

11. The plasma processing apparatus of claim 1, wherein a distance between the solenoid coil and the outer conductor is uniform along the distributed constant line.

12. The plasma processing apparatus of claim 1, wherein the solenoid coil is formed of an air core coil.

13. The plasma processing apparatus of claim 1, wherein the electrical member is a heating element provided within or in the vicinity of a high frequency electrode to which a high frequency power of a preset frequency is applied in order to perform the plasma process, the external circuit is a heater power supply configured to apply a power for heat generation to the heating element, and the line is a power feed line configured to electrically connect the heater power supply and the heating element.

14. A plasma processing apparatus, including an external circuit of a power meter or a signal meter electrically connected via a line to an electrical member within a processing vessel in which a plasma process is performed, configured to reduce or block a high frequency noise of a predetermined frequency introduced from the electrical member into the line toward the external circuit by a filter provided on the line, wherein the filter comprises:

a single solenoid coil which forms a part of the line and has a first section and a second section having independent winding pitches;

a cylindrical outer conductor, accommodating or surrounding the solenoid coil, configured to form, by being combined with the solenoid coil, a distributed constant line in which parallel resonance occurs at multiple frequencies;

first comb teeth which are made of an insulating material and inserted into winding gaps of the solenoid coil in the first section locally in a circumferential direction thereof such that only an outer side surface and a part of upper and lower surfaces of the solenoid coil are covered with the first comb teeth; and a second coil tube which is made of an insulating material and configured to block winding gaps of the solenoid coil entirely in the circumferential direction thereof.

15. A plasma processing apparatus, including an external circuit of a power meter or a signal meter electrically connected via a line to an electrical member within a processing vessel in which a plasma process is performed, configured to reduce or block a high frequency noise of a predetermined frequency introduced from the electrical member into the line toward the external circuit by a filter provided on the line, wherein the filter comprises:

a single solenoid coil forming a part of the line; and a cylindrical outer conductor, accommodating or surrounding the solenoid coil, configured to form, by being combined with the solenoid coil, a distributed constant line in which parallel resonance occurs at multiple frequencies, wherein the solenoid coil has a first section and a second section having different winding pitches in an axis direction thereof, the winding pitch of the first section is equal to or larger than twice the winding pitch of the second section, or equal to or less than ½ the winding pitch of the second section, the filter has, in the first section, first comb teeth which are made of an insulating material and inserted in winding gaps of the solenoid coil locally at plural positions in a circumferential direction thereof, and the first comb teeth are formed on an outer surface of a rod-shaped member composed of a plurality of insulating members which are extended in parallel to the solenoid coil in the coil axis direction and, also, arranged adjacent to an inner peripheral surface of the solenoid coil.

16. A plasma processing apparatus, including an external circuit of a power meter or a signal meter electrically connected via a line to an electrical member within a processing vessel in which a plasma process is performed, configured to reduce or block a high frequency noise of a predetermined frequency introduced from the electrical member into the line toward the external circuit by a filter provided on the line, wherein the filter comprises:

a single solenoid coil forming a part of the line; and a cylindrical outer conductor, accommodating or surrounding the solenoid coil, configured to form, by being combined with the solenoid coil, a distributed constant line in which parallel resonance occurs at multiple frequencies, wherein the solenoid coil has a first section and a second section having different winding pitches in an axis direction thereof, the winding pitch of the first section is equal to or larger than twice the winding pitch of the second section, or equal to or less than ½ the winding pitch of the second section, the filter has, in the first section, first comb teeth which are made of an insulating material and inserted in winding gaps of the solenoid coil locally at plural positions in a circumferential direction thereof, and the first comb teeth are formed on an outer end surface of a plate-shaped member formed of a plurality of insulating members provided within the solenoid coil, and the insulating members are extended in a radial direction of the solenoid coil to come into contact with an inner peripheral surface of the solenoid coil and, also, extended in parallel to the solenoid coil in the coil axis direction.

17. A plasma processing apparatus, including an external circuit of a power meter or a signal meter electrically connected via a line to an electrical member within a processing vessel in which a plasma process is performed, configured to reduce or block a high frequency noise of a predetermined frequency introduced from the electrical member into the line toward the external circuit by a filter provided on the line, wherein the filter comprises:

a single solenoid coil forming a part of the line; and a cylindrical outer conductor, accommodating or surrounding the solenoid coil, configured to form, by being combined with the solenoid coil, a distributed constant line in which parallel resonance occurs at multiple frequencies, wherein the solenoid coil has a first section and a second section in which coil conductors are respectively insulation-coated with a first coil tube and a second coil tube having different dielectric constants.

18. The plasma processing apparatus of claim 17, wherein the dielectric constant of the first coil tube is equal to or larger than twice the dielectric constant of the second coil tube, or equal to or less than ½ of the dielectric constant of the second coil tube.

* * * * *